(12) United States Patent
Eom

(10) Patent No.: US 12,340,039 B2
(45) Date of Patent: Jun. 24, 2025

(54) DISPLAY PANEL THAT INCLUDES AT LEAST ONE OPENING INSIDE A DISPLAY AREA AND ELECTRONIC APPARATUS INCLUDING THE SAME

(71) Applicant: SAMSUNG DISPLAY CO., LTD., Yongin-si (KR)

(72) Inventor: Cheolhwan Eom, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/486,290

(22) Filed: Oct. 13, 2023

(65) Prior Publication Data

US 2024/0126390 A1 Apr. 18, 2024

(30) Foreign Application Priority Data

Oct. 18, 2022 (KR) .................. 10-2022-0134444

(51) Int. Cl.
| | |
|---|---|
| *G06F 3/041* | (2006.01) |
| *G06F 3/044* | (2006.01) |
| *G09G 3/3233* | (2016.01) |
| *H10K 59/40* | (2023.01) |
| *H10K 59/65* | (2023.01) |
| *H10K 59/80* | (2023.01) |

(52) U.S. Cl.
CPC .......... *G06F 3/0412* (2013.01); *G06F 3/0445* (2019.05); *G09G 3/3233* (2013.01); *H10K 59/40* (2023.02); *H10K 59/65* (2023.02); *H10K 59/873* (2023.02); *G09G 2300/0819* (2013.01); *G09G 2300/0852* (2013.01); *G09G 2300/0861* (2013.01)

(58) Field of Classification Search
CPC ...... H10K 59/65; H10K 59/40; H10K 59/873; H10K 50/844; G09G 3/3233; G09G 2300/0819; G09G 2300/0852; G09G 2300/0861; G06F 3/0412; G06F 3/0445; G06F 3/0446; G06F 2203/04112
See application file for complete search history.

(56) References Cited

U.S. PATENT DOCUMENTS

| | | |
|---|---|---|
| 9,271,395 B2 | 2/2016 | Hongo et al. |
| 9,640,881 B2 | 5/2017 | Min |
| | (Continued) | |

FOREIGN PATENT DOCUMENTS

| | | |
|---|---|---|
| CN | 111679482 | 9/2020 |
| CN | 112272940 | 1/2021 |
| | (Continued) | |

*Primary Examiner* — Yaron Cohen
(74) *Attorney, Agent, or Firm* — F. CHAU & ASSOCIATES, LLC

(57) ABSTRACT

A display panel of an electronic apparatus includes a substrate that includes a display area and a first opening, a light-emitting element disposed in the display area around the first opening, an encapsulation layer disposed on the light-emitting element, where the encapsulation layer includes at least one inorganic encapsulation layer, an organic encapsulation layer and a second opening that corresponds to the first opening, and an input sensing layer disposed on the encapsulation layer and that includes a third opening that corresponds to the second opening. The input sensing layer includes a metal layer that surrounds the third opening.

28 Claims, 20 Drawing Sheets

(56) References Cited

U.S. PATENT DOCUMENTS

| | | | |
|---|---|---|---|
| 10,391,750 | B2 | 8/2019 | Kim et al. |
| 11,106,066 | B2 | 8/2021 | Inoue et al. |
| 11,114,511 | B2 | 9/2021 | Choi et al. |
| 2017/0287992 | A1 | 10/2017 | Kwak et al. |
| 2020/0161582 | A1* | 5/2020 | Choi ............... G06F 3/0412 |

FOREIGN PATENT DOCUMENTS

| | | |
|---|---|---|
| KR | 10-2017-0111827 | 10/2017 |
| KR | 10-1975490 | 4/2019 |
| KR | 10-2031654 | 10/2019 |
| KR | 10-2021-0024292 | 3/2021 |
| KR | 10-2346798 | 12/2021 |

* cited by examiner

DISPLAY PANEL THAT INCLUDES AT LEAST ONE OPENING INSIDE A DISPLAY AREA AND ELECTRONIC APPARATUS INCLUDING THE SAME

CROSS-REFERENCE TO RELATED APPLICATION

This application claims priority under 35 U.S.C. § 119 from Korean Patent Application No. 10-2022-0134444, filed on Oct. 18, 2022 in the Korean Intellectual Property Office, the contents of which are herein incorporated by reference in their entirety.

TECHNICAL FIELD

One or more embodiments are directed to an apparatus, and more particularly, to a display panel and an electronic apparatus that includes the same.

DISCUSSION OF THE RELATED ART

The usage of display panels has diversified in recent years. In addition, as display panels have become thinner and lighter, their range of use has gradually extended.

As the area occupied by a display area in display panels expands, various functions that are combined or associated with display panels have been added. Alternatively, a portion of the display area can be used for functions other than displaying images.

SUMMARY

One or more embodiments include a display panel that includes at least one opening inside a display area, and an electronic apparatus.

According to one or more embodiments, a display panel includes a substrate that includes a display area and a first opening, a light-emitting element disposed in the display area around the first opening, an encapsulation layer disposed on the light-emitting element, where the encapsulation layer includes at least one inorganic encapsulation layer, an organic encapsulation layer and a second opening that corresponds to the first opening, and an input sensing layer disposed on the encapsulation layer and that includes a third opening that corresponds to the second opening. The input sensing layer includes a metal layer that surrounds the third opening.

The metal layer may include a (3-1)st opening that corresponds to the third opening.

The the (3-1)st opening may be wider than the third opening in a plan view.

The input sensing layer may further include a first touch insulating layer disposed on the encapsulation layer, a first touch conductive layer disposed on the first touch insulating layer, a second touch insulating layer disposed on the first touch conductive layer, and a second touch conductive layer disposed on the second touch insulating layer.

The metal layer may include a same material as one of the first touch conductive layer or the second touch conductive layer.

The metal layer may be disposed on one of the first touch insulating layer or the second touch insulating layer.

The metal layer may directly contact the encapsulation layer.

An upper surface of the metal layer may be plasma-processed.

The display panel may further include a first light-blocking layer disposed on at least one of an inner surface of the first opening, an inner surface of the second opening, or an inner surface of the third opening.

A width of a cross-section of the first light-blocking layer may increase from the first opening toward the third opening.

The first light-blocking layer may include black ink.

The display panel may further include a cover window disposed on the input sensing layer.

The display panel may further include a second light-blocking layer that includes a fifth opening and is disposed on a lower surface of the cover window. The fifth opening corresponds to the first opening.

The third opening may be wider than the fifth opening in a plan view.

The display panel may further include an adhesive layer disposed between the cover window and the input sensing layer.

The adhesive layer may include a sixth opening that corresponds to the first opening, and the sixth opening may be wider than the first opening in a plan view.

According to one or more embodiments, an electronic apparatus includes a display panel that includes a transmissive area, a display area, and a first non-display area disposed between the transmissive area and the display area, and a component disposed below the display panel and that corresponds to the transmissive area. The display panel includes a substrate that includes a first opening, a light-emitting element disposed in a display area around the first opening, an encapsulation layer disposed on the light-emitting element, where the encapsulation layer includes at least one inorganic encapsulation layer, an organic encapsulation layer and a second opening that corresponds to the first opening, and an input sensing layer disposed on the encapsulation layer and that includes a third opening that corresponds to the second opening. The input sensing layer includes a metal layer that surrounds the third opening.

The metal layer may include a (3-1)st opening that corresponds to the third opening, and the (3-1)st opening may be wider than the third opening in a plan view.

The input sensing layer may further include a first touch insulating layer disposed on the encapsulation layer, a first touch conductive layer disposed on the first touch insulating layer, a second touch insulating layer disposed on the first touch conductive layer, and a second touch conductive layer disposed on the second touch insulating layer, and the metal layer may include a same material as one of the first touch conductive layer or the second touch conductive layer.

The metal layer may be disposed on one of the first touch insulating layer or the second touch insulating layer.

The metal layer may directly contact the encapsulation layer.

An upper surface of the metal layer may be plasma-processed.

The display panel may further include a first light-blocking layer disposed on at least one of an inner surface of the first opening, an inner surface of the second opening, or an inner surface of the third opening.

A width of a cross-section of the first light-blocking layer may increase from the first opening toward the third opening.

The display panel may further include a cover window disposed on the input sensing layer, and an adhesive layer disposed between the input sensing layer and the cover window.

The display panel may further include a second light-blocking layer that includes a fifth opening and is disposed on a lower surface of the cover window. The fifth opening corresponds to the first opening.

The third opening may be wider than the fifth opening in a plan view.

The adhesive layer may include a sixth opening that corresponds to the first opening, and the sixth opening may be wider than the first opening in a plan view.

DETAILED DESCRIPTION

Figure 1A:
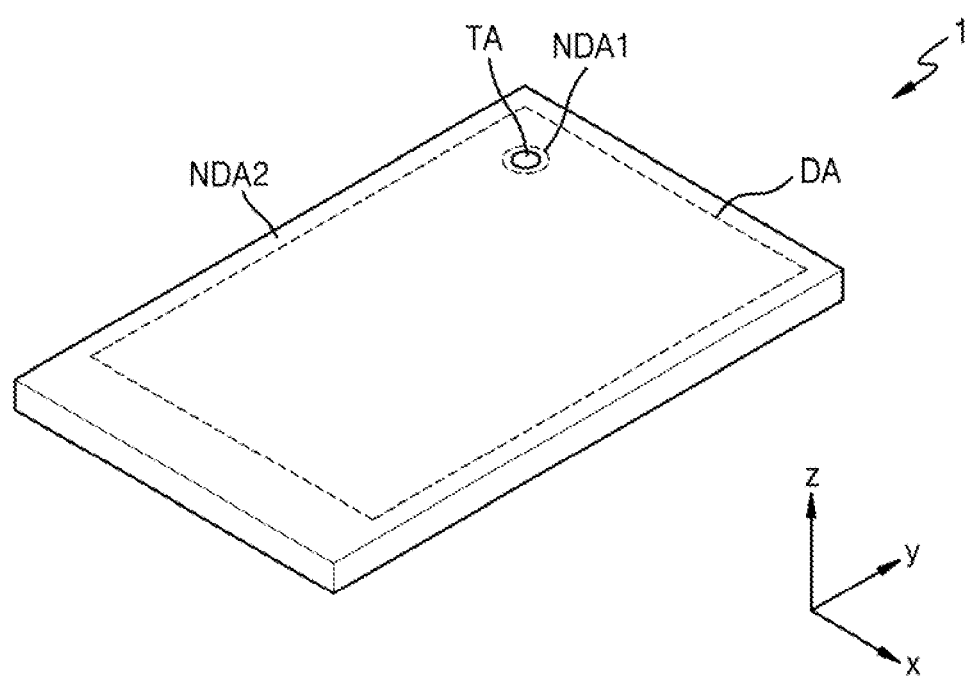
FIGS. 1A and 1B are perspective views of an electronic apparatus according to an embodiment.

Reference will now be made in detail to embodiments, examples of which are illustrated in the accompanying drawings, wherein like reference numerals may refer to like elements throughout.

It will be further understood that, when a layer, region, or element is referred to as being "on" another layer, region, or element, it can be directly or indirectly on the other layer, region, or element.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the case where a certain embodiment may be implemented differently, a specific process order may be performed in the order different from the described order. As an example, two processes successively described may be simultaneously performed substantially and performed in the opposite order.

Figure 1B:
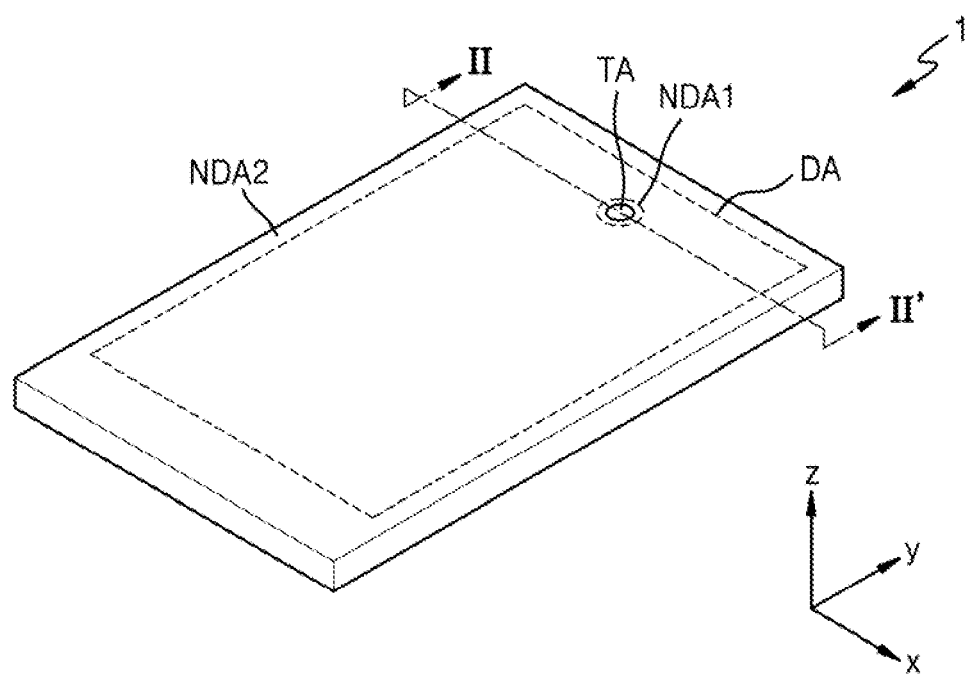

FIGS. 1A and 1B are perspective views of an electronic apparatus 1 according to an embodiment.

Referring to FIGS. 1A and 1B, in an embodiment, the electronic apparatus 1 includes an apparatus for displaying moving images or still images and can be used as a display screen for various products, such as televisions, notebook computers, monitors, advertisement boards, Internet of things (IoTs) devices, as well as portable electronic apparatuses, such as mobile phones, smart phones, tablet personal computers, mobile communication terminals, electronic organizers, electronic books, portable multimedia players (PMPs), navigation apparatuses, and ultra mobile personal computers (UMPCs). In addition, the electronic apparatus 1 can be used in wearable devices, such as smartwatches, watchphones, glasses-type displays, and head-mounted displays (HMDs). In addition, in an embodiment, the electronic apparatus 1 can be used as an instrument panel for an automobile, a center fascia for an automobile, or a center information display (CID) on a dashboard, a room mirror display that replaces a side mirror of an automobile, and as a display on the backside of a front seat as entertainment for passengers in the back seat of an automobile. The electronic apparatus 1 is bendable, foldable, or rollable. FIGS. 1A and 1B show, for convenience of description, that the electronic apparatus 1 according to an embodiment is used as a smartphone, but embodiments are not necessarily limited thereto.

The electronic apparatus 1 has a rectangular shape in a plan view. For example, as shown in FIGS. 1A and 1B, the electronic apparatus 1 has a rectangular shape that has short sides in the x direction and long sides in the y direction in a plan view. A corner where the short side in the x direction meets the long side in the y direction may be rounded to have a preset curvature or have a right angle. A planar shape of the electronic apparatus 1 is not necessarily limited to a rectangle, but may have other shapes, such as other polygons, an ellipse, or an irregular shape.

The electronic apparatus 1 includes a transmissive area TA or a first region and a display area DA or a second region that at least partially surrounds the transmissive area TA. The electronic apparatus 1 includes a first non-display area NDA1 or a third region and a second non-display area NDA2, where the first non-display area NDA1 is located between the transmissive area TA and the display area DA, and the second non-display area NDA2 is located outside the display area DA, for example, surrounding the display area DA.

The transmissive area TA is located inside the display area DA. In an embodiment, the transmissive area TA is arranged on the upper left side of the display area DA as shown in FIG. 1A. In an embodiment, the transmissive area TA is arranged on the upper center of the display area DA as shown in FIG. 1B. In an embodiment, the transmissive area TA is arranged on the upper right side of the display area DA. However, embodiments are not necessarily limited thereto, and in other embodiment, various modifications are made. In a plan view of an electronic apparatus 1 according to an embodiment, "left," "right," "up," and "down" denote directions when the electronic apparatus 1 is viewed in a direction perpendicular to the electronic apparatus 1. For example, "left" denotes a −x direction, "right" denotes a +x direction, "up" denotes a +y direction, and "down" denotes a −y direction. Although FIGS. 1A and 1B show one transmissive area TA, other embodiments include a plurality of transmissive areas TA.

Figure 2A:
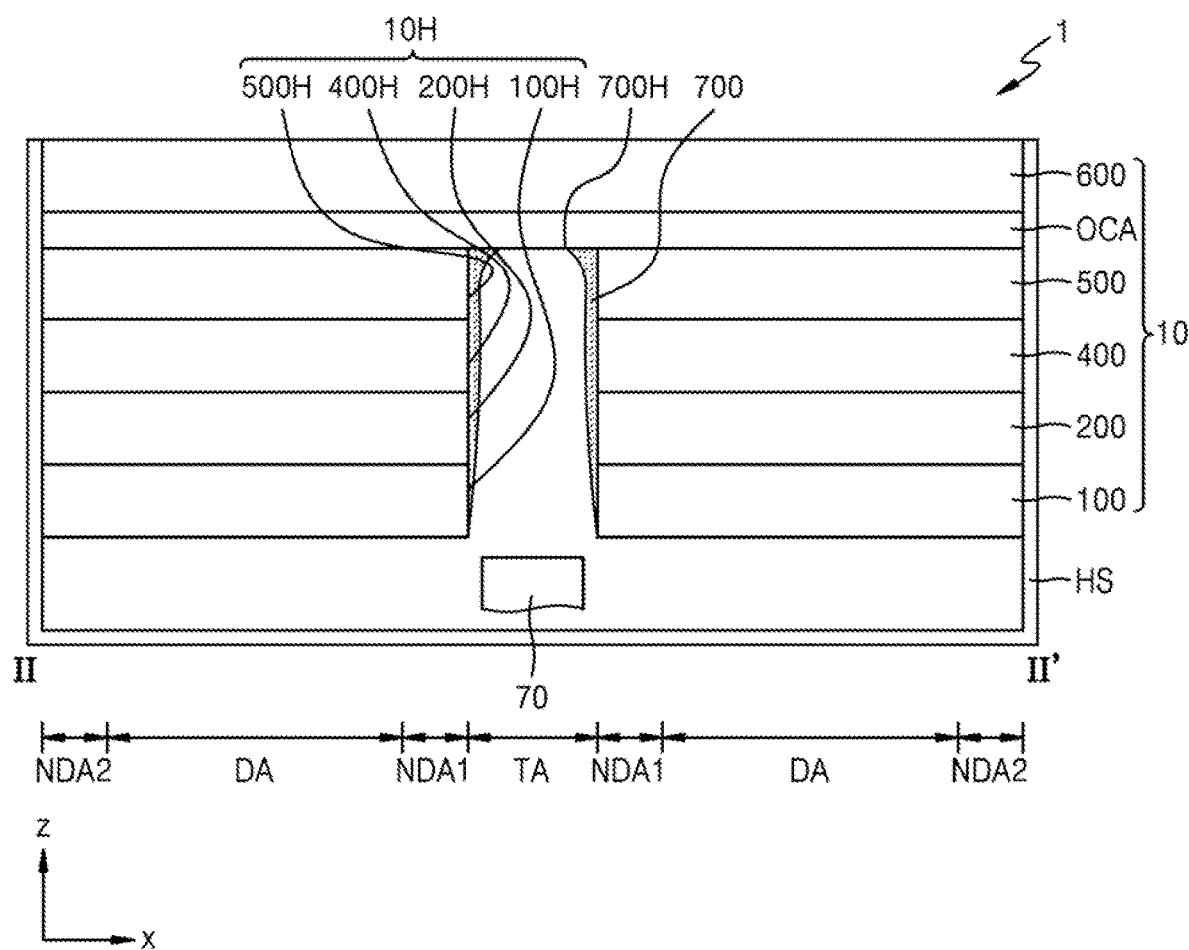
FIGS. 2A to 2D are cross-sectional views of a display panel, taken along a line II-IT of FIG. 1B, according to an embodiment.

FIG. 2A is a cross-sectional view of a display panel 10, taken along a line II-IT of FIG. 1B, according to an embodiment.

Referring to FIG. 2A, in an embodiment, the electronic apparatus 1 includes a display panel 10 and a component 70 disposed in the transmissive area TA of the display panel 10. The display panel 10 and the component 70 are received in a housing HS.

The display panel 10 includes a substrate 100, a display layer 200, an input sensing layer 400, an optical functional layer 500, and a cover window 600.

The display layer 200 includes light-emitting elements that emit light to display images, and circuit elements that are electrically connected to the light-emitting elements and include transistors.

The input sensing layer 400 obtains coordinate information that corresponds to an external input, such as a touch event. The input sensing layer 400 includes a sensing or touch electrode and trace lines connected to the sensing or touch electrode. The input sensing layer 400 is disposed on the display layer 200. The input sensing layer 400 can sense an external input by using a self-capacitance method and/or a mutual capacitance method.

The input sensing layer 400 may be directly formed on the display layer 200, or may be separately formed and then coupled to the display layer 200 by using an optically clear adhesive. For example, the input sensing layer 400 is successively formed after a process of forming the display layer 200. For example, no adhesive layer is disposed between the input sensing layer 400 and the display layer 200. Although FIG. 2 shows that the input sensing layer 400 is disposed between the display layer 200 and the optical functional layer 500, in an embodiment, the input sensing layer 400 is disposed on the optical functional layer 500, and the optical functional layer 500 is disposed between the display layer 200 and the input sensing layer 400.

The optical functional layer 500 includes an anti-reflection layer. The anti-reflection layer reduces the reflectivity of external light that is incident on the display panel 10 through the cover window 600. The anti-reflection layer includes a retarder and a polarizer.

In an embodiment, the anti-reflection layer includes a black matrix and color filters. The color filters are arranged to correspond to the color of light emitted from the light-emitting diodes of the display layer 200. In an embodiment, the anti-reflection layer includes a destructive interference structure. A destructive interference structure includes a first reflection layer and a second reflection layer in different layers. First-reflected light and second-reflected light respectively reflected by the first reflection layer and the second reflection layer destructively interfere and reduce the reflectivity of external light.

The optical functional layer 500 may include a lens layer. The lens layer improves a light output efficiency of light emitted from the display layer 200 and/or reduces color deviation. The lens layer includes concave or convex lens shapes, and/or a plurality of layers that have different refractive indexes. The optical functional layer 500 may include both the anti-reflection layer and the lens layer described above, or one of the anti-reflection layer or the lens layer.

The display panel 10 includes an opening 10H. For example, FIG. 2A shows that the substrate 100, the display layer 200, the input sensing layer 400, and the optical functional layer 500 respectively include first to fourth openings 100H, 200H, 400H, and 500H, and the first to fourth openings 100H, 200H, 400H, and 500H overlap one another.

The first opening 100H is a through hole that extends from an upper surface to a lower surface of the substrate 100. The second opening 200H is a through hole that extends from an upper surface to a lower surface of the display layer 200, the third opening 400H is a through hole that extends from an upper surface to a lower surface of the input sensing layer 400, and the fourth opening 500H is a through hole that extends from an upper surface to a lower surface of the optical functional layer 500. The first to fourth openings 100H, 200H, 400H, and 500H are formed in the transmissive area TA and overlap each other. The first to fourth openings 100H, 200H, 400H, and 500H may be equal to or different from each other in size or diameter.

In an embodiment, at least one of the substrate 100, the display layer 200, the input sensing layer 400, or the optical functional layer 500 does not include an opening. For example, one, two, or three of the substrate 100, the display layer 200, the input sensing layer 400, and the optical functional layer 500 does not include an opening.

The cover window 600 is disposed on the optical functional layer 500. The cover window 600 is attached to the optical functional layer 500 by an adhesive layer OCA therebetween. For example, the adhesive layer OCA includes an adhesive material such as a transparent optical clear adhesive. The cover window 600 includes one of glass or plastic. The plastic is one or more of polyethersulfone, polyacrylate, polyetherimide, polyethylene naphthalate, polyethylene terephthalate, polyphenylene sulfide, polyarylate, polyimide, polycarbonate, or cellulose acetate propionate.

The cover window 600 includes a flexible window. For example, the cover window 600 is one of a polyimide window or an ultra-thin glass window.

The transmissive area TA is component area, such as a sensor region, a camera region, a speaker region, etc., in which the component 70 is located. The component 70 adds various functions to the electronic apparatus 1 and overlaps the opening 10H of the display panel 10.

The component 70 includes an electronic element. For example, the component 70 is an electronic element that uses light or sound. For example, the electronic element may be a sensor such as an infrared sensor that uses light, a camera that receives light to capture an image, a sensor that outputs and senses light or sound to measure a distance or recognize a fingerprint, a small lamp that outputs light, or a speaker that outputs sound. An electronic element that uses light may use light in various wavelength bands, such as visible light, infrared light, ultraviolet light, etc. Light and/or sound output from the component 70 or received by the component 70 propagates through the transmissive area TA.

In an embodiment, when the electronic apparatus 1 is used as a smartwatch or an instrument panel for an automobile, the component 70 includes clock hands or a needle that indicates predetermined information, such as the velocity of a vehicle, etc. For example, unlike FIG. 2A, the cover window 600 includes an opening in the transmissive area TA such that the component 70 is externally exposed. In an embodiment, when the component 70 of the electronic apparatus 1 is a speaker, the opening of cover window 600 corresponds to the transmissive area TA.

The input sensing layer 400 includes a metal layer. For example, the metal layer includes an opening that corresponds to the opening 10H. The metal layer is described in detail below.

The display panel 10 includes a light-blocking layer 700. For example, at least a portion of the light-blocking layer 700 is disposed inside the opening 10H. The light-blocking layer 700 includes a fifth opening 700H. For example, the fifth opening 700H is formed inside the opening 10H. For example, the opening 10H is wider than the fifth opening 700H. For example, the fifth opening 700H is formed in a portion of the light-blocking layer 700 that contacts the cover window 600.

The light-blocking layer 700 includes black ink. In addition, the light-blocking layer 700 is also formed in the second non-display area NDA2 of the display panel 10. For example, the light-blocking layer 700 is disposed inside the adhesive layer OCA or on the lower surface of the cover window 600.

The light-blocking layer 700 is disposed on the inner surface of at least one of the first opening 100H to the fourth opening 500H. Hereinafter, for convenience of description, an embodiment where the light-blocking layer 700 is entirely disposed inside the first opening 100H to the fourth opening 500H is mainly described.

The width of the cross-section of the light-blocking layer 700, which is measured in an x-axis direction in FIG. 2A, increases from the substrate 100 toward the optical functional layer 500. For example, a width in the x-axis direction of the fifth opening 700H decreases from the substrate 100 toward the optical functional layer 500. The light-blocking layer 700 prevents external light that enters the inside of the opening 10H from reducing the intensity of light emitted from the display area DA, or prevents deterioration of the performance of the component 70 by light emitted from the display area DA.

Figure 2B:
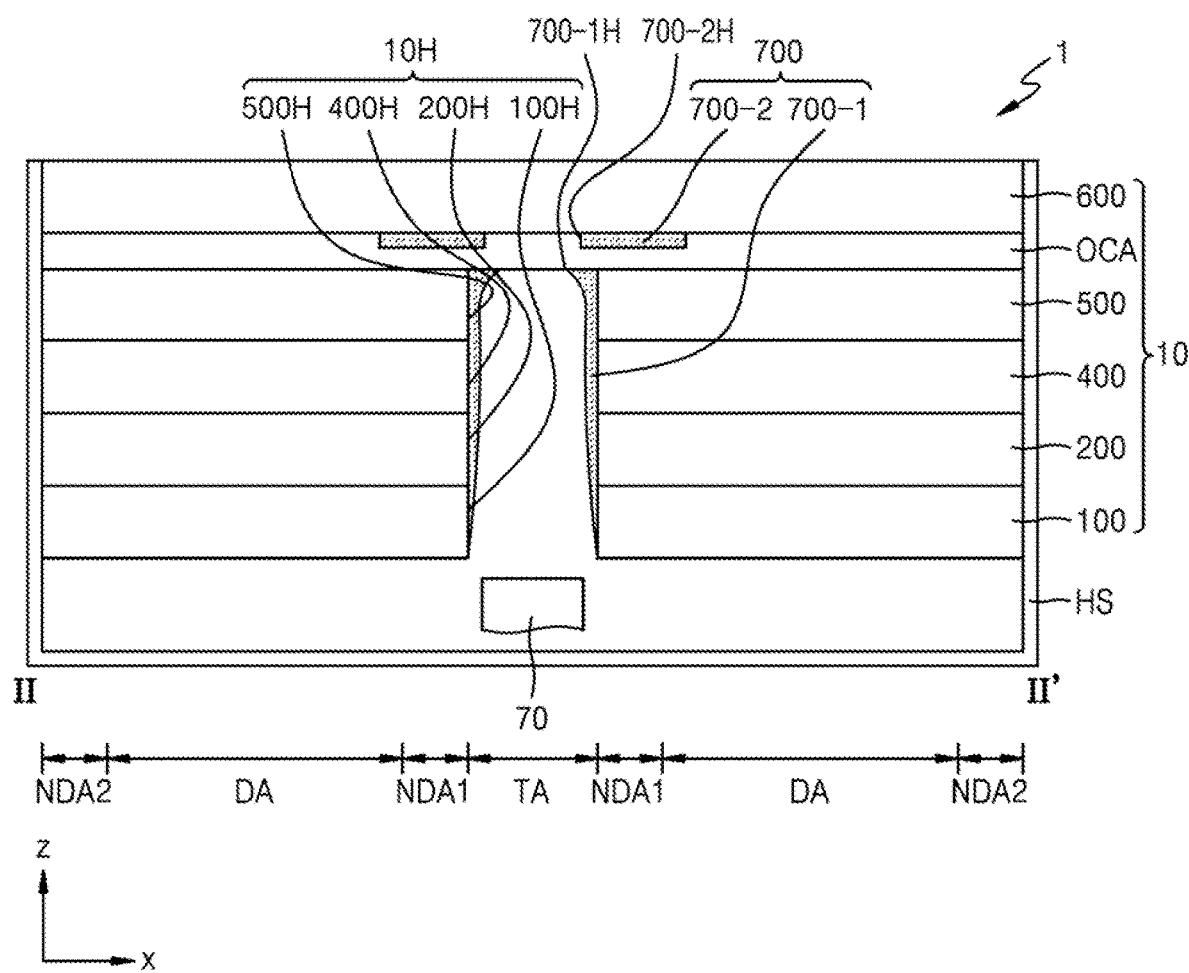

FIG. 2B is a cross-sectional view of the display panel 10, taken along the line II-IT of FIG. 1B, according to an embodiment.

Referring to FIG. 2B, in an embodiment, the electronic apparatus 1 includes the display panel 10 and the component 70 disposed in the transmissive area TA of the display panel 10. The display panel 10 and the component 70 are received in the housing HS. For example, because the display panel 10, the component 70, and the housing HS are the same as or similar to those described with reference to FIG. 2A, repeated descriptions thereof are omitted.

The display panel 10 includes a metal layer and the light-blocking layer 700. The metal layer is described in detail below.

The light-blocking layer 700 includes a first light-blocking layer 700-1 and a second light-blocking layer 700-2, where the first light-blocking layer 700-1 is disposed inside the opening 10H, and the second light-blocking layer 700-2 is disposed in the transmissive area TA and at least partially overlaps the first non-display area NDA1. The first light-blocking layer 700-1 includes a first-fifth opening 700-1H that is formed inside the opening 10H. For example, because the first light-blocking layer 700-1 and the first-fifth opening 700-1H are the same as or similar to the light-blocking layer 700 and the fifth opening 700H, respectively, described with reference to FIG. 2A, a repeated descriptions thereof are omitted.

The second light-blocking layer 700-2 is partially disposed in the first non-display area NDA1. For example, the second light-blocking layer 700-2 is disposed inside the adhesive layer OCA or between the adhesive layer OCA and the cover window 600. The second light-blocking layer 700-2 includes a second-fifth opening 700-2H that corresponds to the opening 10H. For example, the second-fifth opening 700-2H overlaps the opening 10H. The second light-blocking layer 700-2 transmits external light through the second-fifth opening 700-2H and blocks external light in the other portions. In addition, the second light-blocking layer 700-2 blocks light reflected from the outside and incident to the component 70, and light emitted from the display area DA around the component 70.

As described with reference to FIG. 2A, the light-blocking layer 700 may also be disposed in the second non-display area NDA2.

Figure 2C:
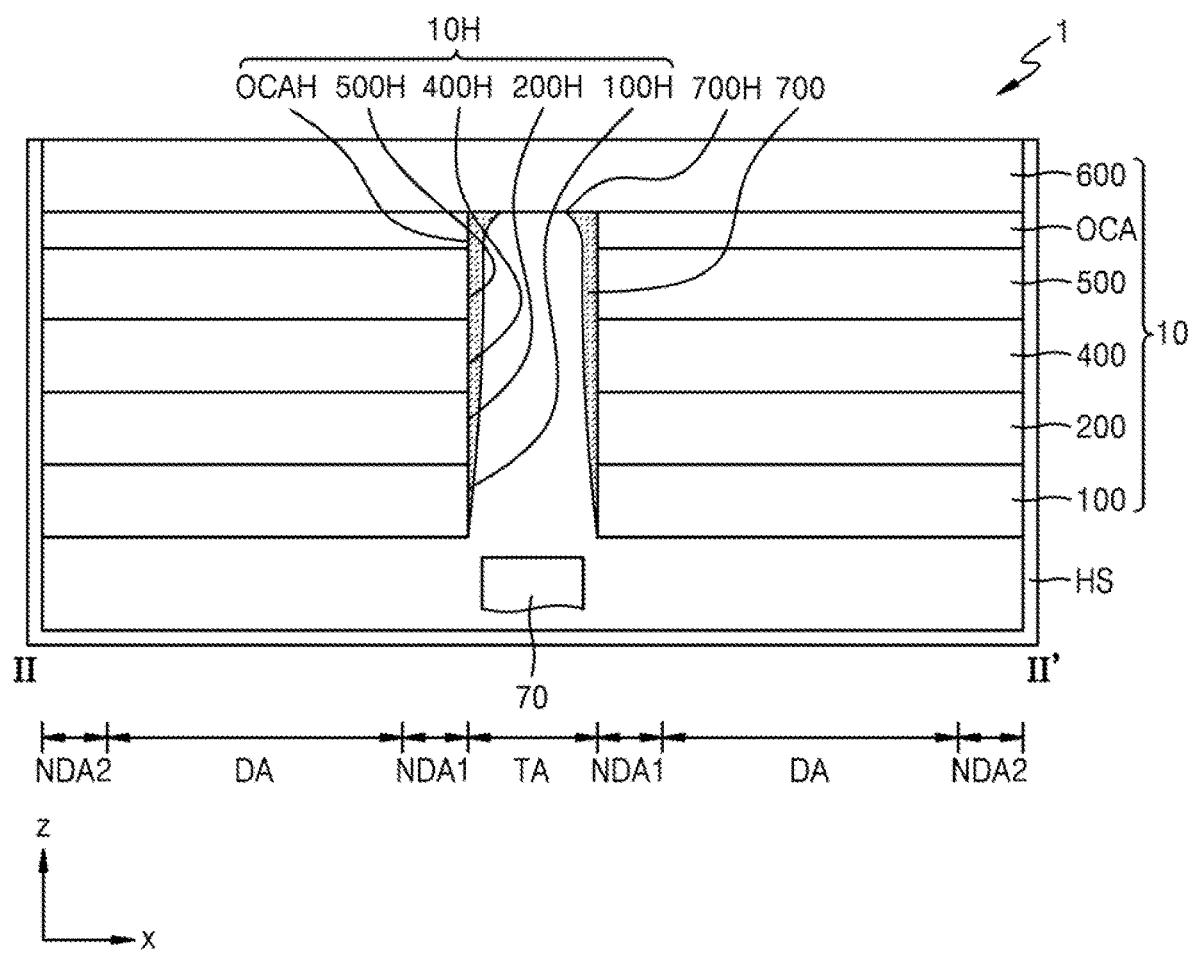

FIG. 2C is across-sectional view of the display panel 10, taken along the line II-IT of FIG. 1B, according to an embodiment.

Referring to FIG. 2C, in an embodiment, the electronic apparatus 1 includes the display panel 10 and the component 70 disposed in the transmissive area TA of the display panel 10. The display panel 10 and the component 70 are received in the housing HS. Because the display panel 10, the component 70, and the housing HS are the same as or similar to those described with reference to FIG. 2A, repeated descriptions thereof are omitted.

The display panel 10 includes a metal layer and the light-blocking layer 700. The metal layer is described in detail below.

The adhesive layer OCA is disposed between the cover window 600 and the optical functional layer 500. The adhesive layer OCA and the opening 10H include a sixth opening OCAH. The sixth opening OCAH has a same planar shape as at least one of the first opening 100H, the second opening 200H, the third opening 400H, and the fourth opening 500H. For example, the sixth opening OCAH overlaps and is aligned with at least one of the first opening 100H, the second opening 200H, the third opening 400H, and the fourth opening 500H. Because only the cover window 600 is disposed on the sixth opening OCAH, which corresponds to the opening 10H, distortion of external light incident into the opening 10H is reduced.

The light-blocking layer 700 is disposed inside the opening 10H. For example, the light-blocking layer 700 is disposed on the inner surface of at least one of the first opening 100H to the fourth opening 500H and the sixth opening OCAH. Hereinafter, for convenience of description, an embodiment in which the light-blocking layer 700 is entirely disposed inside the first opening 100H to the fourth opening 500H and the sixth opening OCAH is mainly described.

In an embodiment, width of the cross-section of the light-blocking layer 700 measured in one direction, such as the x-axis direction in FIG. 2C, increases from the substrate 100 toward the adhesive layer OCA, and a width of the fifth opening 700H decreases from the substrate 100 toward the adhesive layer OCA. In an embodiment, the width of the light-blocking layer 700 is uniform on the entire inner surface of the opening 10H.

In addition, the light-blocking layer 700 may include the first light-blocking layer and the second light-blocking layer as shown in FIG. 2B. For example, the first light-blocking layer covers the inner side of the sixth opening OCAH of the adhesive layer OCA, and the second light-blocking layer has a shape similar to a that of the second light-blocking layer 700-2 shown in FIG. 2B.

Figure 2D:
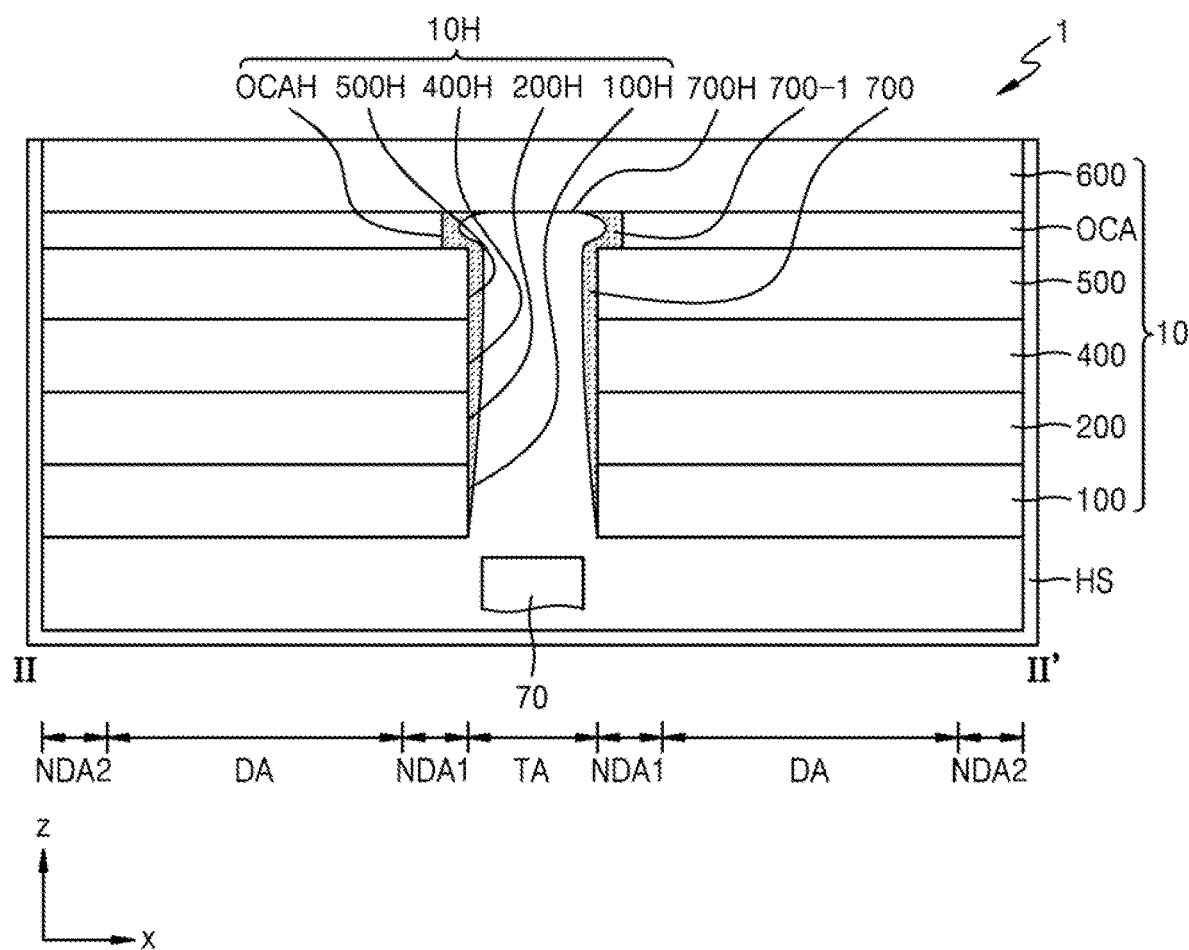

FIG. 2D is a cross-sectional view of the display panel 10, taken along the line II-IT of FIG. 1B, according to an embodiment.

Referring to FIG. 2D, in an embodiment the electronic apparatus 1 includes the display panel 10 and the component 70 disposed in the transmissive area TA of the display panel 10. The display panel 10 and the component 70 are received in the housing HS. Because the display panel 10, the component 70, and the housing HS are the same as or similar to those described with reference to FIG. 2A, repeated descriptions thereof are omitted.

The display panel 10 includes a metal layer and the light-blocking layer 700. The metal layer is described in detail below.

The adhesive layer OCA and the opening 10H include the sixth opening OCAH. For example, at least one of the first opening 100H to the fourth opening 500H is located within the sixth opening OCAH. For example, the width in one direction, such as the x-axis direction of FIG. 2D, of each of first opening 100H to the fourth opening 500H is less than the width in one direction, such as the x-axis direction of FIG. 2D of the sixth opening OCAH. For example, the opening 10H at the level of the adhesive layer OCA protrudes into the adhesive layer OCA. Hereinafter, for convenience of description, an embodiment in which the sixth opening OCAH is wider than each of the first opening 100H to the fourth opening 500H is mainly described.

The light-blocking layer 700 is disposed inside the opening 10H. For example, the width of the light-blocking layer 700 measured in one direction, such as the x-axis direction in FIG. 2D, varies in at least a portion of the opening 10H. For example, the width of the light-blocking layer 700 increases from the substrate 100 toward the optical functional layer 500.

For example, the light-blocking layer 700 includes an indented portion in the inner surface of the sixth opening OCAH that corresponds to the inner shape of the sixth opening OCAH.

In addition, the light-blocking layer 700 may include the first light-blocking layer 700-1 and the second light-blocking layer as shown in FIG. 2B. In this case, the first light-blocking layer 700-1 covers the inner side of the sixth opening OCAH of the adhesive layer OCA, and the second light-blocking layer has a shape similar to that of the second light-blocking layer 700-2 shown in FIG. 2B.

Figure 3A:
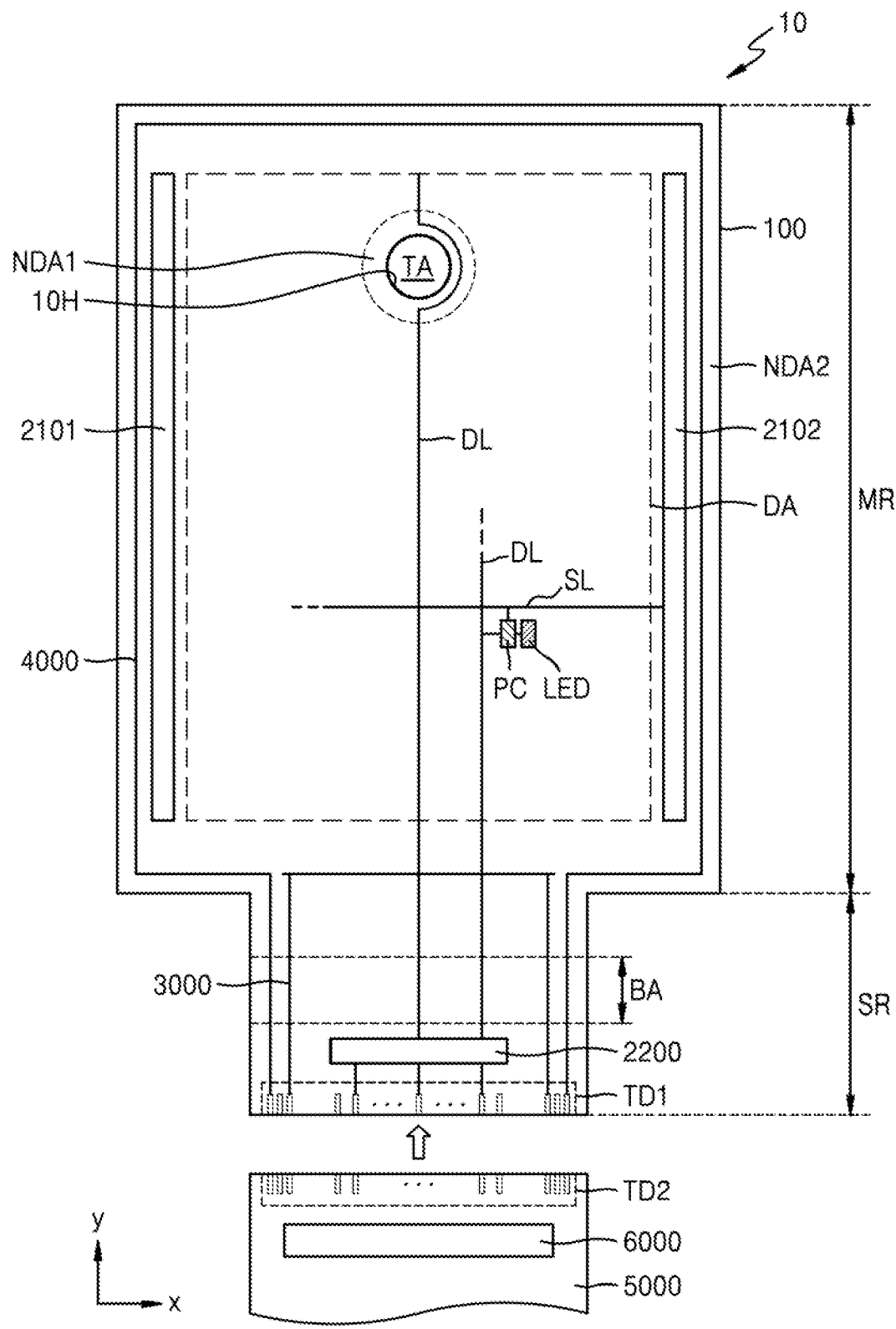
FIG. 3A is a plan view of the display panel according to an embodiment.
Figure 3B:
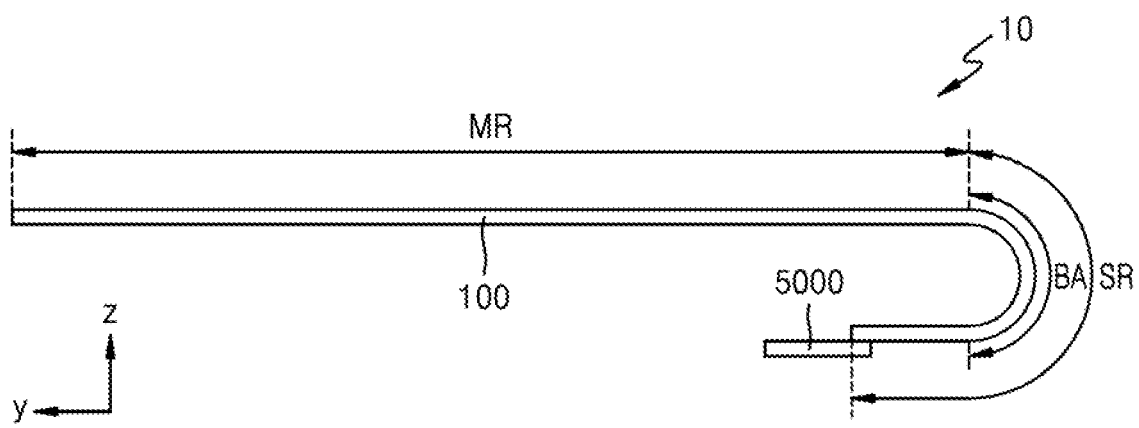
FIG. 3B is a side view of a display panel of FIG. 3A.

FIG. 3A is a plan view of the display panel 10 according to an embodiment, and FIG. 3B is a side view of the display panel 10 of FIG. 3A.

Referring to FIG. 3A, in an embodiment, the display panel 10 includes the display area DA, the transmissive area TA, the first non-display area NDA1, and the second non-display area NDA2.

The display area DA can display images, and may have one of various shapes, such as a circular shape, an elliptical shape, a polygonal shape, a specific figure, etc. Although FIG. 1 shows that the display area DA has an approximate rectangular shape, embodiments are not necessarily limited thereto, and in other embodiments, the display area DA has an approximate rectangular shape with rounded edges.

The display panel 10 includes light-emitting diodes LED as light-emitting elements disposed in the display area DA, and displays images by using light emitted from the light-emitting diodes LED, such as red, green, and blue light. The light-emitting diode LED includes an organic light-emitting diode that includes an organic emission layer. In an embodiment, the light-emitting diode LED is an inorganic light-emitting diode that includes an inorganic material. An inorganic light-emitting diode includes a PN-junction diode that includes inorganic semiconductor-based materials. When a forward voltage is applied to a PN-junction diode, holes and electrons are injected and energy created by recombination of the holes and the electrons is converted to light, and thus, light of a preset color is emitted. An inorganic light-emitting diode may have a width of several micrometers to hundreds of micrometers, or several nanometers to hundreds of nanometers. An emission layer of the light-emitting diode LED includes the organic material or an inorganic material. In an embodiment, the emission layer of the light-emitting diode LED includes quantum dots. For example, the light-emitting diode LED is a quantum-dot light-emitting diode.

The light-emitting diode LED is electrically connected to a sub-pixel circuit PC that includes transistors and can be turned on/off. For example, FIG. 3A shows a scan line SL and a data line DL as signal lines electrically connected to the sub-pixel circuit PC. The sub-pixel circuits PC are arranged in the display area DA.

The transmissive area TA is located inside the display area DA and is entirely surrounded by the display area DA. In an embodiment, the transmissive area TA is located in the upper center of the display area DA as shown in FIG. 3A. In an embodiment, the transmissive area TA is located in the upper left side of the display area DA, or the upper right side of the display area DA. However, embodiments are not necessarily limited thereto, and in other embodiments, the transmissive area TA is located at various other positions.

The first non-display area NDA1 has no light-emitting diodes LED disposed therein, and is located between the transmissive area TA and the display area DA. The first non-display area NDA1 entirely surrounds the transmissive area TA. Signal lines that transmit signals to the sub-pixel circuits PC disposed around the transmissive area TA pass across the first non-display area NDA1. For example, the data line DL and/or the scan line SL cross the display area DA in a y direction and/or an x direction. Portions of the data line DL and/or the scan line SL detour around the first non-display area NDA1 along the opening 10H formed in the transmissive area TA of the display panel 10. In an embodiment, FIG. 3A shows that the data line DL detours around the transmissive area TA.

The first non-display area NDA1 includes a structure that prevents permeation of moisture. When the display panel 10 includes the opening 10H in the transmissive area TA, a structure that prevents moisture that may enter through the opening 10H from permeating into the display area DA is disposed in the first non-display area NDA1. For example, a layer, such as first and second functional layers described below, that includes an organic material is continuously formed in the display area DA to entirely cover the display area DA, but is discontinuously formed in the first non-display area NDA1. For example, a layer, such as the first and second functional layers described below, that includes an organic material includes a plurality of portions disposed and separated from each other in the first non-display area NDA1.

The second non-display area NDA2 is located outside the display area DA. The second non-display area NDA2 entirely surrounds the display area DA. A portion, hereinafter referred to as a protrusion peripheral area, of the second non-display area NDA2 extends in a direction away from the display area DA. For example, the display panel 10 includes a main region MR and a sub region SR that extends in one direction from the main region MR, where the main region MR includes the transmissive area TA, the first non-display area NDA1, the display area DA, and a portion of the second non-display area NDA2 that surrounds the display area DA. The sub region SR corresponds to the protrusion peripheral area. The sub region SR extends from one of the short sides of the display panel 10. The width in the x direction of the sub region SR is less than the width in the x direction of the main region MR. A portion BA of the sub region SR is bent as shown in FIG. 3B. When the display panel 10 is bent as shown in FIG. 3B, the second non-display area NDA2 is not viewed, or the viewable area is reduced even though the second non-display area NDA2 is viewed when the electronic apparatus 1 (see FIG. 1A or 1B) is viewed.

The shape of the display panel 10 is substantially the same as that of the substrate 100. In an embodiment, the substrate 100 includes the transmissive area TA, the first non-display area NDA1, the display area DA, and the second non-display area NDA2. In an embodiment, the substrate 100 includes the main region MR and the sub region SR.

A first driving circuit 2101, a second driving circuit 2102, a data driving circuit 2200, a driving voltage supply line 3000, and a common voltage supply line 4000 are disposed in the second non-display area NDA2. The first driving circuit 2101 and the second driving circuit 2102 are provide scan signals to each sub-pixel circuit PC, the data driving circuit 2200 provides data signals to each sub-pixel circuit PC, the driving voltage supply line 3000 provides a first power voltage ELVDD (see FIG. 4), and the common voltage supply line 4000 provides a second power voltage ELVSS (see FIGS. 4A and 4B).

The first driving circuit 2101 is disposed opposite the second driving circuit 2102 with the display area DA therebetween. A scan line SL on the left of the transmissive area TA is electrically connected to the first driving circuit 2101, and a scan line SL on the right of the transmissive area TA is electrically connected to the second driving circuit 2102.

The data driving circuit 2200 transmits data signals to the sub-pixel circuit PC through the data line DL that passes across the display area DA. The driving voltage supply line 3000 is disposed on one side of the display area DA, and the common voltage supply line 4000 partially surrounds the display area DA.

A first terminal part TD1 is located on one side of the substrate 100. The first terminal part TD1 is located on one side of the sub region SR of the display panel 10. A printed circuit board 5000 is attached to the first terminal part TD1. The printed circuit board 5000 includes a second terminal part TD2 that is electrically connected to the first terminal part TD1. A controller 6000 is disposed on the printed circuit board 5000. Control signals of the controller 6000 are provided to each of the first and second driving circuits 2101 and 2102, the data driving circuit 2200, the driving voltage supply line 3000, and the common voltage supply line 4000 through the first and second terminal parts TD1 and TD2.

Although FIG. 3A shows that the data driving circuit 2200 is disposed on the substrate 100, embodiments are not necessarily limited thereto, and in other embodiments, the data driving circuit 2200 is disposed on a printed circuit board that is electrically connected to a pad located on one side of the display panel 10. The printed circuit board is flexible, and a portion of the printed circuit board is bent below the backside of the substrate 100.

Figure 4A:
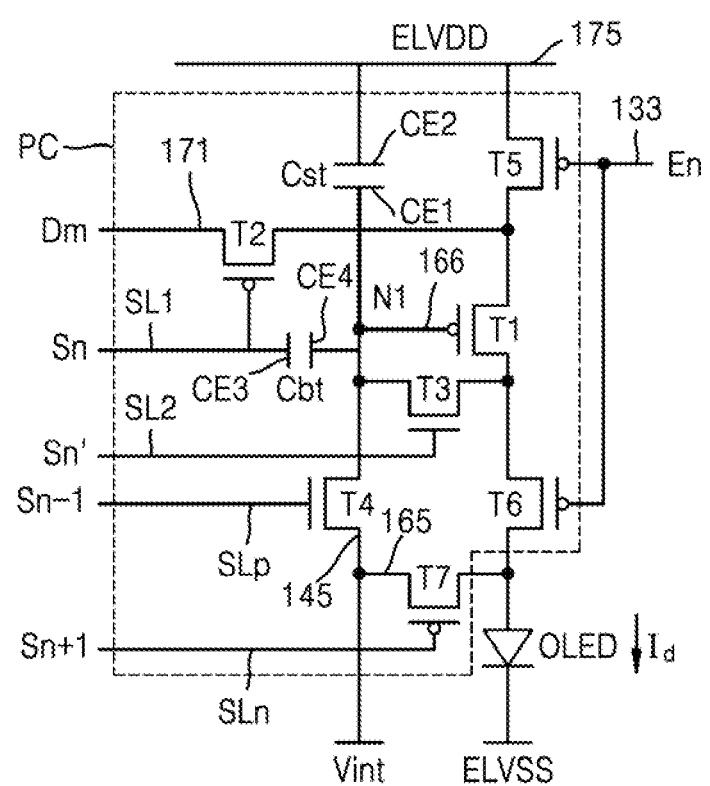
FIG. 4A illustrates an equivalent circuit of a sub-pixel circuit connected to a light-emitting diode of a display panel, according to an embodiment.

FIG. 4A illustrates an equivalent circuit of a sub-pixel circuit PC connected to a light-emitting diode of a display panel according to an embodiment. As described above with reference to FIG. 3A, the emission layer of the light-emitting diode may include an organic material, an inorganic material, and/or quantum dots. In an embodiment, FIG. 4A illustrates an embodiment where the light-emitting diode is an organic light-emitting diode OLED. Although FIG. 4A shows that the light-emitting diode includes an organic light-emitting diode OLED, embodiments are not necessarily limited thereto, and in other embodiments, the display panel 10 (e.g., referring to FIG. 3A) includes an inorganic light-emitting diode or a quantum-dot light-emitting diode instead of a organic light-emitting diode OLED. The organic light-emitting diode OLED is electrically connected to the sub-pixel circuit PC.

Referring to FIG. 4A, in an embodiment, the sub-pixel circuit PC includes first to seventh transistors T1, T2, T3, T4, T5, T6, and T7, a storage capacitor Cst, and a boost capacitor Cbt. In an embodiment, the sub-pixel circuit PC does not include the boost capacitor Cbt. Hereinafter, for convenience of description, an embodiment where the sub-pixel circuit PC includes the boost capacitor Cbt is described.

Some of the transistors T1, T2, T3, T4, T5, T6, and T7 are n-channel metal oxide semiconductor (NMOS) field-effect transistors (n-channel MOSFET), and the rest are p-channel metal oxide semiconductor (PMOS) field-effect transistors (p-channel MOSFET). In an embodiment, the third and fourth transistors T3 and T4 are n-channel MOSFETs, and the rest are p-channel MOSFETs. In an embodiment, the third, fourth, and seventh transistors T3, T4, and T7 are n-channel MOSFETs, and the rest are p-channel MOSFETs. In an embodiment, only one of the first to seventh transistors T1, T2, T3, T4, T5, T6, and T7 is an n-channel MOSFET, and the rest are p-channel MOSFETs.

The first to seventh transistors T1, T2, T3, T4, T5, T6, and T7, the storage capacitor Cst, and the boost capacitor Cbt are connected to signal lines. Signal lines includes a first scan line SL1 that transmits a first scan signal Sn, a second scan line SL2 that transmits a second scan signal Sn', a previous scan line SLp that transmits a previous scan signal Sn−1, an emission control line 133 that transmits an emission control signal En, a next scan line SLn that transmits a next scan signal Sn+1, and a data line 171 that crosses the first scan line SL1 and transmits a data signal Dm.

A driving voltage line 175 transmits a first power voltage ELVDD to the first transistor T1, and first and second initialization voltage lines 145 and 165 transmit an initialization voltage Vint that performs initialization.

The first transistor T1 is a driving transistor. A first gate electrode (or a first control electrode) of the first transistor T1 is connected to the storage capacitor Cst, a first electrode of the first transistor T1 is electrically connected to the driving voltage line 175 through the fifth transistor T5, and a second electrode of the first transistor T1 is electrically connected to a pixel electrode of the organic light-emitting diode OLED through the sixth transistor T6. One of the first electrode or the second electrode of the first transistor T1 is a source electrode, and the other is a drain electrode. The first transistor T1 receives a data signal Dm according to a switching operation of the second transistor T2 and supplies a driving current $I_d$ to the organic light-emitting diode OLED.

The second transistor T2 is a switching transistor. A second gate electrode (or a second control electrode) of the second transistor T2 is connected to the first scan line SL1, a first electrode of the second transistor T2 is connected to the data line 171, and a second electrode of the second transistor T2 is connected to the first electrode of the first transistor T1 and electrically connected to the driving voltage line 175 through the fifth transistor T5. One of the first electrode or the second electrode of the second transistor T2 is a source electrode, and the other is a drain electrode. The second transistor T2 is turned on by a first scan signal Sn received through the first scan line SL1 and performs a switching operation of transmitting a data signal Dm to the first electrode of the first transistor T1, where the data signal Dm is received through the data line 171.

The third transistor T3 is a compensation transistor that compensates for a threshold voltage of the first transistor T1. A third gate electrode (or a compensation control electrode) of the third transistor T3 is connected to the second scan line SL2. A first electrode of the third transistor T3 is connected to a lower electrode CE1 of the storage capacitor Cst, and is connected to the first gate electrode of the first transistor T1 through a node connection line 166. A first electrode of the third transistor T3 is connected to the fourth transistor T4. A second electrode of the third transistor T3 is connected to the second electrode of the first transistor T1 and to the pixel electrode of the organic light-emitting diode OLED through the sixth transistor T6. One of the first electrode or the second electrode of the third transistor T3 is a source electrode, and the other is a drain electrode.

The third transistor T3 is turned on by a second scan signal Sn' received through the second scan line SL2, and diode-connects the first transistor T1 by electrically connecting the first gate electrode to the second electrode of the first transistor T1.

The fourth transistor T4 is a first initialization transistor that initializes the first gate electrode of the first transistor T1. A fourth gate electrode (or a fourth control electrode) of the fourth transistor T4 is connected to the previous scan line SLp. A first electrode of the fourth transistor T4 is connected to a first initialization voltage line 145. A second electrode of the fourth transistor T4 is connected to the lower electrode CE1 of the storage capacitor Cst, the first electrode of the third transistor T3, and the first gate electrode of the first transistor T1. One of the first electrode or the second electrode of the fourth transistor T4 is a source electrode, and the other is a drain electrode. The fourth transistor T4 is turned by a previous scan signal Sn−1 received through the previous scan line SLp and performs an initialization operation of initializing the voltage of the first gate electrode of the first transistor T1 by transmitting an initialization voltage Vint to the first gate electrode of the first transistor T1.

The fifth transistor T5 is an operation control transistor. A fifth gate electrode (or a fifth control electrode) of the fifth transistor T5 is connected to the emission control line 133, a first electrode of the fifth transistor T5 is connected to the driving voltage line 175, and a second electrode of the fifth transistor T5 is connected to the first electrode of the first transistor T1 and the second electrode of the second transistor T2. One of the first electrode or the second electrode of the fifth transistor T5 is a source electrode, and the other is a drain electrode.

The sixth transistor T6 is an emission control transistor. A sixth gate electrode (or a sixth control electrode) of the sixth transistor T6 is connected to the emission control line 133, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the pixel electrode of the organic light-emitting diode OLED. One of the first electrode or the second electrode of the sixth transistor T6 is a source electrode, and the other is a drain electrode.

The fifth transistor T5 and the sixth transistor T6 are simultaneously turned on by an emission control signal En received through the emission control line 133, after which the first power voltage ELVDD is transmitted to the organic light-emitting diode OLED and the driving current $I_d$ flows to the organic light-emitting diode OLED.

The seventh transistor T7 is a second initialization transistor that initializes the pixel electrode of the organic light-emitting diode OLED. A seventh gate electrode (or a seventh control electrode) of the seventh transistor T7 is connected to the next scan line SLn. A first electrode of the seventh transistor T7 is connected to a second initialization voltage line 165. The second electrode of the seventh transistor T7 is connected to the second electrode of the sixth transistor T6 and the pixel electrode of the organic light-emitting diode OLED. The seventh transistor T7 is turned on by a next scan signal Sn+1 received through the next scan line SLn and initializes the pixel electrode of the organic light-emitting diode OLED. Although FIG. 4A shows that the seventh transistor T7 is connected to the next scan line SLn, embodiments are not necessarily limited thereto, and in an embodiment, the seventh transistor T7 is connected to the emission control line 133, and is thus driven by an emission control signal En.

The storage capacitor Cst includes a lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line 175. The storage capacitor Cst stores a charge that corresponds to a difference between a voltage of the first gate electrode of the first transistor T1 and the first power voltage ELVDD.

The boost capacitor Cbt includes a third electrode CE3 and a fourth electrode CE4. The third electrode CE3 is connected to the second gate electrode of the second transistor T2 and the first scan line SL1, and the fourth electrode CE4 is connected to the first electrode of the third transistor T3 and the node connection line 166. The boost capacitor Cbt raises the voltage of a first node Ni when a first scan signal Sn supplied to the first scan line SL1 is turned off. When the voltage of the first node Ni is raised, a black grayscale can be clearly expressed.

The first node Ni is where the first gate electrode of the first transistor T1, the first electrode of the third transistor T3, the second electrode of the fourth transistor T4, and the fourth electrode CE4 of the boost capacitor Cbt are connected to each other.

In an embodiment shown in FIG. 4A, the third and fourth transistors T3 and T4 are n-channel MOSFETs, and the first, second, fifth to seventh transistors T1, T2, T5, T6, and T7 are p-channel MOSFETs. The first transistor T1 directly influences the brightness of the display panel and includes a semiconductor layer that includes polycrystalline silicon that has high reliability, and thus, a high-resolution display panel can be implemented through this configuration.

Figure 4B:
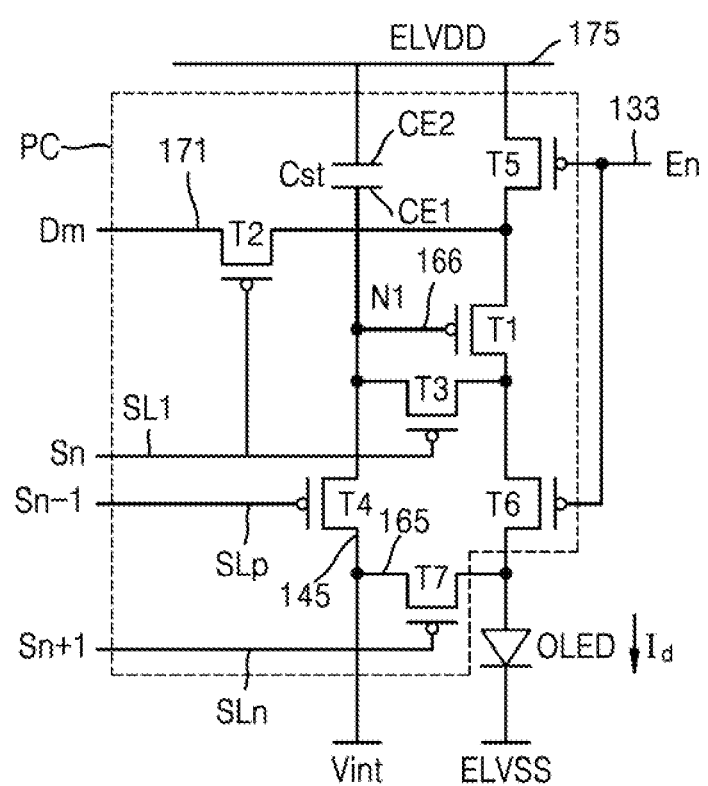
FIG. 4B illustrates an equivalent circuit of a sub-pixel circuit connected to a light-emitting diode of a display panel, according to an embodiment.

FIG. 4B illustrates an equivalent circuit of a sub-pixel circuit PC connected to a light-emitting diode of a display panel according to an embodiment. In an embodiment shown in FIG. 4B, all of the first to seventh transistors T1, T2, T3, T4, T5, T6, and T7 are p-channel MOSFETs, and the boost capacitor is omitted.

As shown in FIG. 4B, in an embodiment, both the second transistor T2 and the third transistor T3 are connected to the same scan line, such as the first scan line SL1. The other elements are the same as those described above with reference to FIG. 4A.

Figure 5:
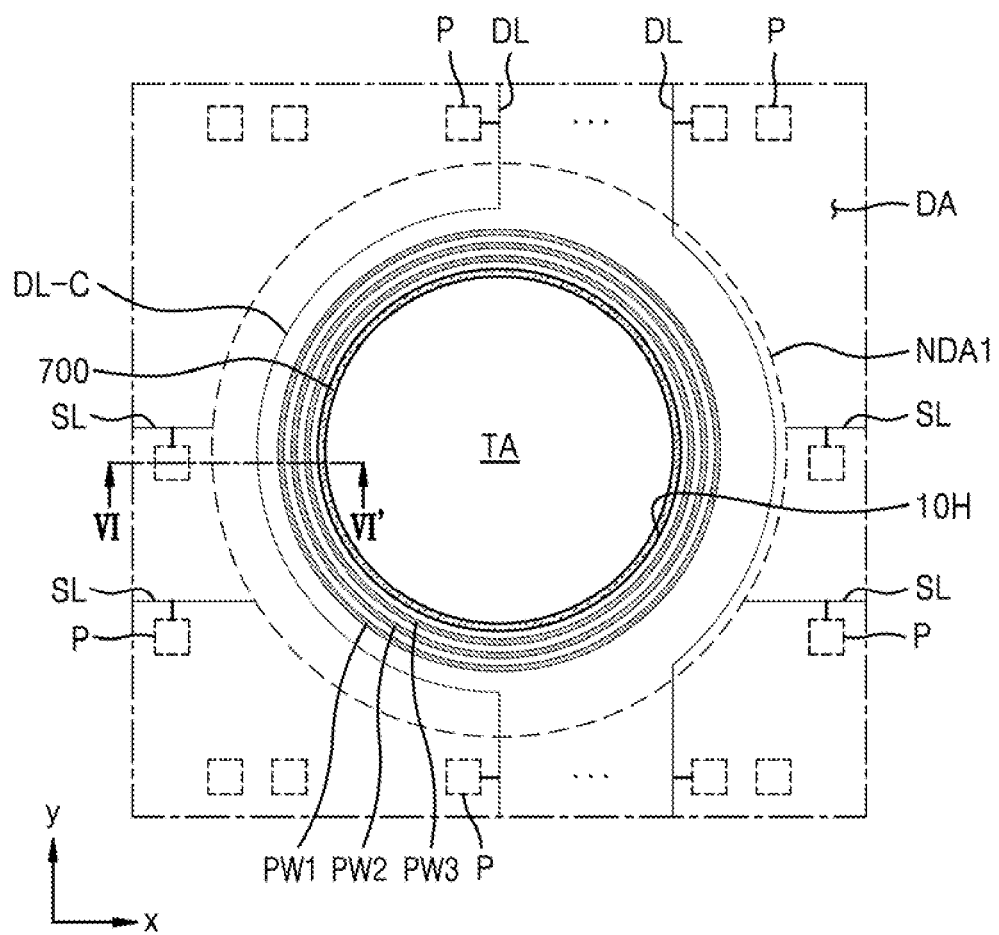
FIG. 5 is a plan view of a portion of a display panel according to an embodiment.

FIG. 5 is a plan view of a portion of the display panel 10 according to an embodiment.

Referring to FIG. 5, in an embodiment, sub-pixels P are disposed in the display area DA, and the first non-display area NDA1 is located between the transmissive area TA and the display area DA.

The sub-pixels P adjacent to the transmissive area TA are spaced apart from each other around the transmissive area TA in a plan view. The sub-pixels P may be vertically spaced apart from each other around the transmissive area TA, or horizontally spaced apart from each other around the transmissive area TA. The sub-pixel P is a minimum area from which light is emitted, and is a region from which red, green, or blue light is emitted. Light of the sub-pixel P is emitted by the light-emitting diode described above with reference to FIG. 3A. The positions of the sub-pixels P respectively correspond to the positions of the light-emitting diodes. Accordingly, when the sub-pixels P are spaced apart from each other around the transmissive area TA in a plan view, the light-emitting diodes are also spaced apart from each other around the transmissive area TA in a plan view. For example, in a plan view, the light-emitting diodes may be vertically spaced apart from each other around the transmissive area TA, or horizontally spaced apart from each other around the transmissive area TA.

Among the signal lines that supply signals to a sub-pixel circuit that is electrically connected to a light-emitting diode of each sub-pixel P, signal lines adjacent to the transmissive area TA detour around the transmissive area TA and/or the opening 10H. Some of data lines DL cross the display area DA in ±y directions and provide data signals to sub-pixels P that are vertically arranged with the transmissive area TA therebetween, and detour along the edge of the transmissive area TA and/or the opening 10H in the first non-display area NDA1. Some of scan lines SL cross the display area DA and are horizontally arranged with the transmissive area TA therebetween, and are spaced apart from each other. For example, a left scan line SL and a right scan line SL are arranged on the same row, and are separated and spaced apart from each other with the transmissive area TA therebetween.

At least one partition wall is located in the first non-display area NDA1, and the at least one partition wall is closer to the transmissive area TA than a detouring portion DL-C of the data lines DL. For example, FIG. 5 shows first to third partition walls PW1, PW2, and PW3. The first to third partition walls PW1, PW2, and PW3 each have a closed loop shape that surrounds the transmissive area TA and/or the opening 10H, and are spaced apart from each other in the first non-display area NDA1.

The light-blocking layer 700 is disposed inside the opening 10H.

Figure 6:
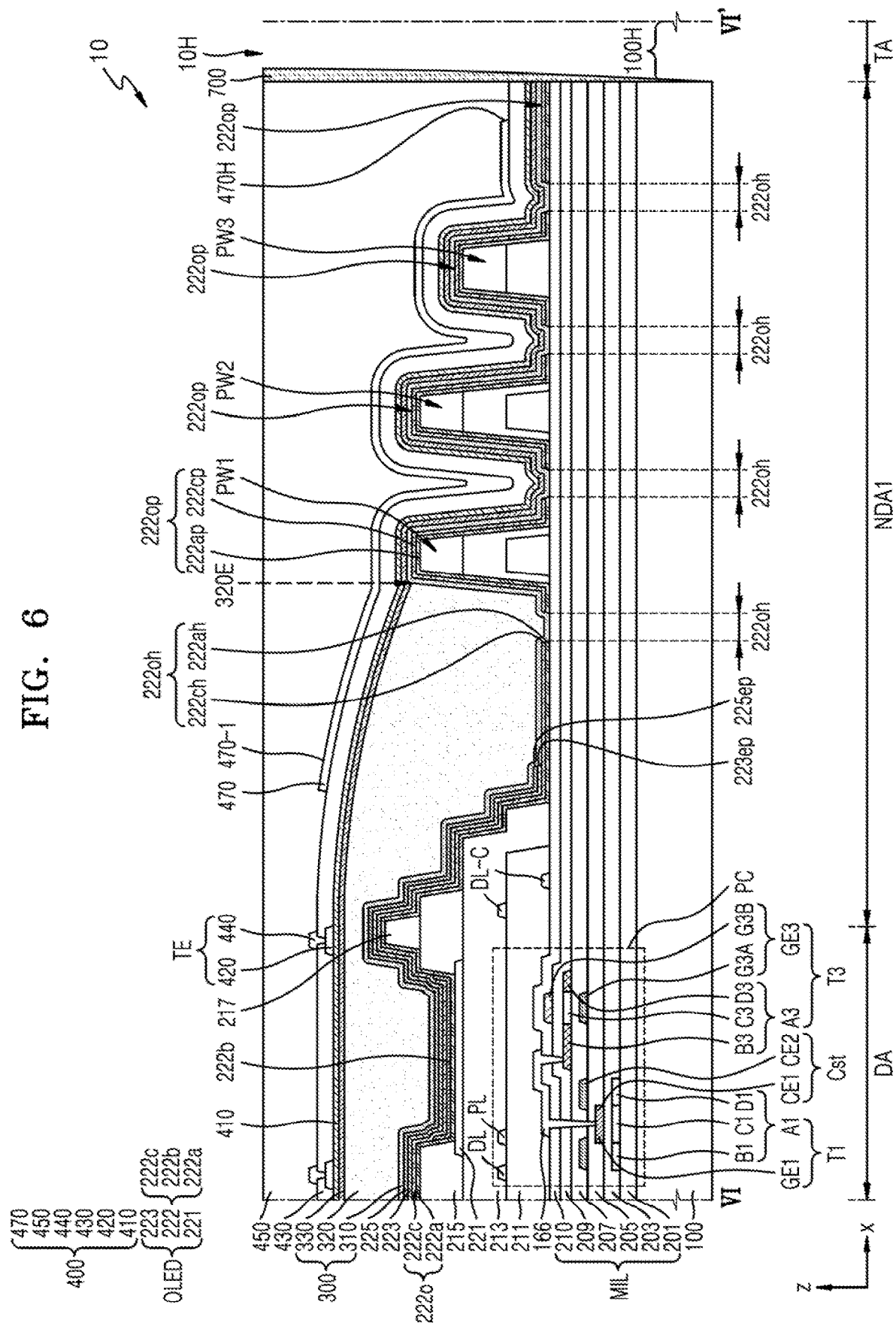
FIG. 6 is a cross-sectional view of a display panel, taken along a line VI-VI' of FIG. 5, according to an embodiment.
Figure 7:
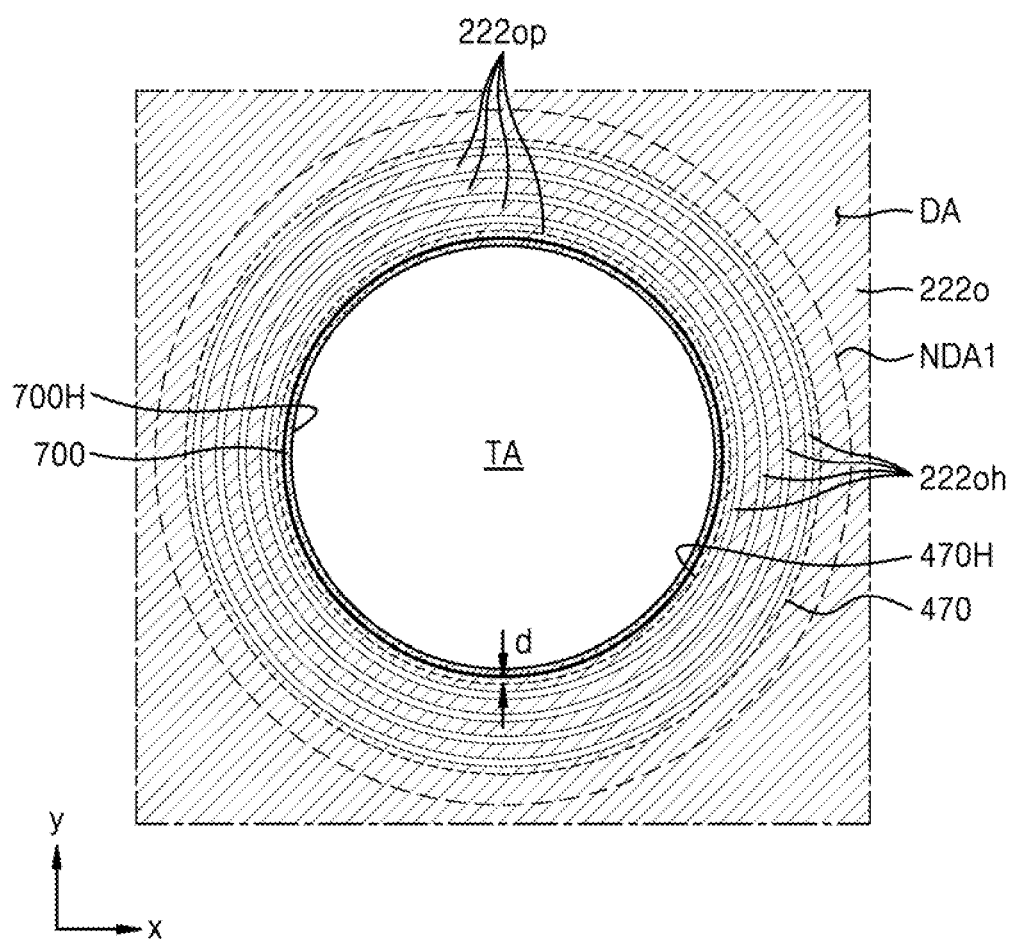
FIG. 7 is a plan view of at least one organic material layer, a metal layer, and a light-blocking layer shown in FIG. 6.
Figure 8:
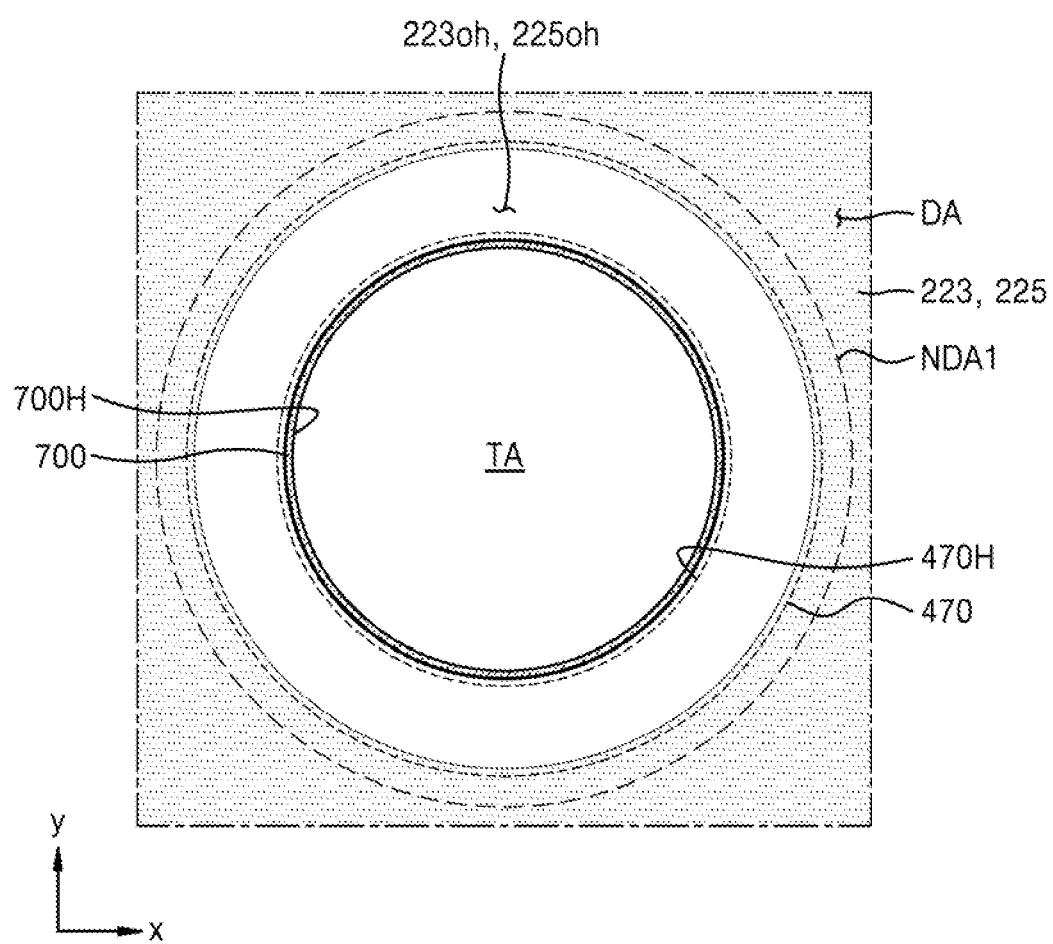
FIG. 8 is a plan view of a second electrode shown in FIG. 6.

FIG. 6 is a cross-sectional view of a display panel 10 taken along a line VI-VI' of FIG. 5, according to an embodiment. FIG. 7 is a plan view of at least one organic material layer, a metal layer 470, and a light-blocking layer 700 shown in FIG. 6. FIG. 8 is a plan view of the second electrode 223 shown in FIG. 6.

Referring to FIG. 6, in an embodiment, the display panel 10 includes the opening 10H in the transmissive area TA. The opening 10H has a through hole shape that penetrates through the upper surface and the lower surface of the display panel 10.

When the display panel 10 includes the opening 10H in the transmissive area TA, each of the plurality of layers in the display panel 10 includes an opening in the transmissive area TA. The substrate 100 includes the first opening 100H in the transmissive area TA. The first opening 100H of the substrate 100 has a through hole shape that penetrates through the upper surface and the lower surface of the substrate 100.

In the display area DA of FIG. 6, the sub-pixel circuit PC is disposed on the substrate 100, and the organic light-emitting diode OLED is disposed on the sub-pixel circuit PC. FIG. 6 shows the sub-pixel circuit PC and the organic light-emitting diode OLED closest to the transmissive area TA. The structures of the sub-pixel circuit PC and the organic light-emitting diode OLED shown in FIG. 6 are the same as the structures of other sub-pixel circuits PC and other organic light-emitting diodes OLED disposed away from the transmissive area TA.

The substrate 100 includes at least one of a glass or a polymer resin. For example, the polymer resin includes at least one of polyethersulfone, polyacrylate, polyetherimide, polyethylene naphthalate, polyethylene terephthalate, polyphenylene sulfide, polyarylate, polyimide, polycarbonate, or cellulose acetate propionate, etc. The substrate 100 that includes the polymer resin is flexible, rollable, or bendable. The substrate 100 may have a multi-layered structure that includes a layer that includes the polymer resin and an inorganic layer.

A buffer layer 201 is disposed on the upper surface of the substrate 100. The buffer layer 201 prevents impurities from penetrating into a semiconductor layer of a transistor. The buffer layer 201 includes an inorganic insulating material such as at least one of silicon nitride, silicon oxynitride, or silicon oxide, and includes a single layer or a multi-layer structure that includes the above inorganic insulating materials.

The sub-pixel circuit PC is disposed on the buffer layer 201. As described above with reference to FIG. 4A, the sub-pixel circuit PC includes a plurality of transistors and a storage capacitor. For example, FIG. 6 shows the first transistor T1, the third transistor T3, and the storage capacitor Cst.

The first transistor T1 includes a first semiconductor layer A1 disposed on the buffer layer 201, and a first gate electrode GE1 that overlaps a channel region C1 of the first semiconductor layer A1. The first semiconductor layer A1 includes a silicon-based semiconductor material, such as polycrystalline silicon. The first semiconductor layer A1 includes the channel region C1, and a first region B1, and a second region D1 respectively arranged on two opposite sides of the channel region C1. The first region B1 and the second region D1 include impurities at a higher concentration than the channel region C1. One of the first region B1 or the second region D1 is a source region, and the other is a drain region.

A first gate insulating layer 203 is disposed on the buffer layer 201 and between the first semiconductor layer A1 and the first gate electrode GE1. The first gate insulating layer 203 includes an inorganic insulating material such as at least one of silicon nitride, silicon oxynitride, or silicon oxide, and includes a single-layered structure or a multi-layered structure that includes the above inorganic insulating materials.

The first gate electrode GE1 includes a conductive material that includes at least one of molybdenum (Mo), aluminum (Al), copper (Cu), or titanium (Ti) and has a single-layered structure or a multi-layered structure that includes the above materials.

The storage capacitor Cst includes the lower electrode CE1 and the upper electrode CE2 that overlap each other. In an embodiment, the lower electrode CE1 of the storage capacitor Cst includes the first gate electrode GE1. For example, the first gate electrode GE1 includes the lower electrode CE1 of the storage capacitor Cst. For example, the first gate electrode GE1 and the lower electrode CE1 of the storage capacitor Cst are formed as one body, and coincide with each other.

A first interlayer insulating layer 205 is disposed on the first gate insulating layer 203 and between the lower electrode CE1 and the upper electrode CE2 of the storage capacitor Cst. The first interlayer insulating layer 205 includes an inorganic insulating material such as at least one of silicon nitride, silicon oxynitride, or silicon oxide, and includes a single-layered structure or a multi-layered structure that includes the above inorganic insulating materials.

The upper electrode CE2 of the storage capacitor Cst includes a low-resistance conductive material such as at least one of molybdenum (Mo), aluminum (Al), copper (Cu) and titanium (Ti), and has a single-layered structure or a multi-layered structure that includes the above materials.

A second interlayer insulating layer 207 is disposed on the first interlayer insulating layer 205 and the storage capacitor Cst. The second interlayer insulating layer 207 includes an inorganic insulating material such as at least one of silicon nitride, silicon oxynitride, or silicon oxide, and includes a single-layered structure or a multi-layered structure that includes the above inorganic insulating materials.

A third semiconductor layer A3 of the third transistor T3 is disposed on the second interlayer insulating layer 207. The third semiconductor layer A3 includes an oxide-based semiconductor material. For example, the third semiconductor layer A3 includes a Zn-oxide-based material, such as at least one of Zn-oxide, In—Zn oxide, or Ga—In—Zn oxide. In an embodiment, the third semiconductor layer A3 includes one of In—Ga—Zn—O (IGZO), In—Sn—Zn—O (ITZO), or In—Ga—Sn—Zn—O (IGTZO), i.e., a semiconductor that contains metals such as indium (In), gallium (Ga), and tin (Sn) in ZnO.

The third semiconductor layer A3 includes a channel region C3, and a first region B3, and a second region D3 respectively arranged on two opposite sides of the channel region C3. One of the first region B3 or the second region D3 is a source region, and the other is a drain region.

The third transistor T3 includes a third gate electrode GE3 that overlaps the channel region C3 of the third semiconductor layer A3. The third gate electrode GE3 has a double gate structure that includes a lower gate electrode G3A and an upper gate electrode G3B, wherein the lower gate electrode G3A is below the channel region C3, and the upper gate electrode G3B is above the channel region C3.

The lower gate electrode G3A is disposed on the same layer, the first interlayer insulating layer 205, as the upper electrode CE2 of the storage capacitor Cst. The lower gate electrode G3A includes the same material as the upper electrode CE2 of the storage capacitor Cst.

The upper gate electrode G3B is disposed over the third semiconductor layer A3 with a second gate insulating layer 209 interposed therebetween. The second gate insulating layer 209 is disposed on the second interlayer insulating layer 207 and includes an inorganic insulating material such as at least one of silicon nitride, silicon oxynitride, or silicon oxide, and includes a single-layered structure or a multi-layered structure that includes the above inorganic insulating materials.

A third interlayer insulating layer 210 is disposed on the second gate insulating layer 209 and the upper gate electrode G3B. The third interlayer insulating layer 210 includes an inorganic insulating material such as silicon oxynitride, and has a single layer or a multi-layer that includes the inorganic insulating materials.

Although FIG. 6 shows that the upper electrode CE2 of the storage capacitor Cst is disposed on the same layer as the lower gate electrode G3A of the third gate electrode GE3, embodiments are not limited necessarily thereto. In an embodiment, the upper electrode CE2 of the storage capacitor Cst is disposed on the same layer as the third semiconductor layer A3, and includes the same material as the first region B3 and the second region D3 of the third semiconductor layer A3.

The first transistor T1 is electrically connected to the third transistor T3 through the node connection line 166. The node connection line 166 is disposed on the third interlayer insulating layer 210. One side of the node connection line 166 is connected to the first gate electrode GE1 of the first transistor T1, and another side of the node connection line 166 is connected to the first region B3 of the third semiconductor layer A3 of the third transistor T3.

The node connection line 166 includes at least one of aluminum (Al), copper (Cu), or titanium (Ti), and includes a single layer or a multi-layer structure that includes the above materials. For example, the node connection line 166 has a triple-layered structure of titanium/aluminum/titanium.

A first organic insulating layer 211 is disposed on the node connection line 166. The first organic insulating layer 211 includes an organic insulating material. The organic insulating material is at least one of acryl, benzocyclobutene (BCB), polyimide, or hexamethyldisiloxane (HMDSO).

The data line DL and the driving voltage line PL are disposed on the first organic insulating layer 211 and covered by a second organic insulating layer 213. The data line DL and the driving voltage line PL each includes at least one of aluminum (Al), copper (Cu), or titanium (Ti), and each includes a single layer or a multi-layer structure that includes the above materials. For example, the data line DL and the driving voltage line PL each have a triple-layered structure of titanium/aluminum/titanium.

The second organic insulating layer 213 includes at least one of acryl, BCB, polyimide, or HMDSO. Although FIG. 6 shows that the data line DL and the driving voltage line PL are disposed on the first organic insulating layer 211, embodiments are not necessarily limited thereto. In an embodiment, one of the data line DL or the driving voltage line PL is disposed on the same layer, such as the third interlayer insulating layer 210, as the node connection line 166.

A first electrode 221 of the organic light-emitting diode OLED is disposed on the second organic insulating layer 213. The first electrode 221 includes a reflective layer that includes at least one of silver (Ag), magnesium (Mg), aluminum (Al), platinum (Pt), palladium (Pd), gold (Au), nickel (Ni), neodymium (Nd), iridium (Jr), or chrome (Cr), or a compound thereof. In an embodiment, the first electrode 221 further includes a conductive oxide material layer on and/or under the reflective layer. The conductive oxide material layer includes at least one of indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first electrode 221 has a triple-layered structure of ITO/Ag/ITO.

A bank layer 215 is disposed on the second organic insulating layer 213 and the first electrode 221. The bank layer 215 includes an opening that exposes the first electrode 221 so that the bank layer 215 covers the edges of the first electrode 221. The bank layer 215 includes an organic insulating material such as polyimide.

A spacer 217 is formed on the bank layer 215. The spacer 217 may be formed together with the bank layer 215 during a process that forms the bank layer 215, or may be formed separately during a separate process. In an embodiment, the spacer 217 includes an organic insulating material such as polyimide. In an embodiment, the bank layer 215 includes an organic insulating material that includes a light-blocking dye, and the spacer 217 includes an organic insulating material such as polyimide.

An intermediate layer 222 is disposed on the bank layer 215 and the portion of the first electrode 221 exposed by the opening. The intermediate layer 222 includes an emission layer 222b. The intermediate layer 222 includes a first functional layer 222a and/or a second functional layer 222c, in which the first functional layer 222a is under the emission layer 222b, and the second functional layer 222c is over the emission layer 222b. The emission layer 222b may include a polymer organic material or a low-molecular weight organic material that emits light of a preset color. The second functional layer 222c may include an electron transport layer (ETL) and/or an electron injection layer (EIL). The first functional layer 222a and the second functional layer 222c each includes an organic material.

A second electrode 223 is disposed on the intermediate layer 222 and includes a conductive material that has a low work function. For example, the second electrode 223 includes a (semi) transparent layer that includes at least one of silver (Ag), magnesium (Mg), aluminum (Al), platinum (Pt), palladium (Pd), gold (Au), nickel (Ni), neodymium (Nd), iridium (Jr), or chrome (Cr), or an alloy thereof. In an embodiment, the second electrode 223 further includes a layer on the (semi) transparent layer, in which the layer includes one of ITO, IZO, ZnO, or $In_2O_3$.

The emission layer 222b overlaps the first electrode 221 through the opening of the bank layer 215. In contrast, an organic material layer, such as the first functional layer 222a and the second functional layer 222c in the intermediate layer 222, covers the entire display area DA. The second electrode 223 covers the entire display area DA.

A capping layer 225 is disposed on the second electrode 223. The capping layer 225 may include an inorganic material or an organic material. The capping layer 225 includes at least one of lithium fluoride (LiF), an inorganic insulating material or an organic insulating material. The capping layer 225 covers the entire display area DA.

The organic light-emitting diode OLED, which includes the first electrode 221, the intermediate layer 222, and the second electrode 223, is covered by an encapsulation layer 300. The encapsulation layer 300 may include at least one organic encapsulation layer and at least one inorganic encapsulation layer. In an embodiment, FIG. 6 shows that the encapsulation layer 300 includes first and second inorganic encapsulation layers 310 and 330, and an organic encapsulation layer 320 therebetween. The encapsulation layer 300 is disposed on the capping layer 225. For example, the second opening 200H (e.g., referring to FIG. 2A to FIG. 2D) extends to not only the display layer 200 but also to the encapsulation layer 300. For example, the second opening 200H is formed in the display layer 200 and the encapsulation layer 300.

The first and second inorganic encapsulation layer 310 and 330 include at least one inorganic material selected from aluminum oxide, titanium oxide, tantalum oxide, hafnium oxide, zinc oxide, silicon oxide, silicon nitride, or silicon oxynitride, etc. The first and second inorganic encapsulation layer 310 and 330 may include a single layer or a multi-layer structure that includes the above materials. The organic encapsulation layer 320 includes a polymer-based material. The polymer-based material includes at least one of an acryl-based resin, an epoxy-based resin, polyimide, or polyethylene. In an embodiment, the organic encapsulation layer 320 includes acrylate.

The thickness of the first inorganic encapsulation layer 310 differs from that of the second inorganic encapsulation layer 330. The thickness of the first inorganic encapsulation layer 310 is greater than that of the second inorganic encapsulation layer 330. In other embodiments, the thickness of the second inorganic encapsulation layer 330 is greater than that of the first inorganic encapsulation layer 310, or the thickness of the first inorganic encapsulation layer 310 is the same as that of the second inorganic encapsulation layer 330.

The input sensing layer 400 is disposed on the encapsulation layer 300. The input sensing layer 400 includes touch electrodes TE and at least one touch insulating layer disposed in the display area DA. For example, FIG. 6 shows that the input sensing layer 400 includes a first touch insulating layer 410, a first touch conductive layer 420, a second touch insulating layer 430, a second touch conductive layer 440, and a third touch insulating layer 450, in which the first touch insulating layer 410 and the first touch conductive layer 420 are disposed on the second inorganic encapsulation layer 330, the second touch insulating layer 430 is disposed on the first touch conductive layer 420, the second touch conductive layer 440 is disposed on the second touch insulating layer 430, and the third touch insulating layer 450 is disposed on the second touch conductive layer 440.

The first touch insulating layer 410, the second touch insulating layer 430, and the third touch insulating layer 450 each include an inorganic insulating material and/or an organic insulating material. In an embodiment, the first touch insulating layer 410 and the second touch insulating layer 430 each include an inorganic insulating material such as at least one of silicon oxide, silicon nitride, or silicon oxynitride, and the third touch insulating layer 450 includes an organic insulating material.

The touch electrode TE of the input sensing layer 400 has a structure in which the first touch conductive layer 420 is connected to the second touch conductive layer 440. In an embodiment, the touch electrode TE includes one of the first touch conductive layer 420 or the second touch conductive layer 440.

Each of the first touch conductive layer 420 and the second touch conductive layer 440 includes at least one of aluminum (Al), copper (Cu), or titanium (Ti), and includes a single layer or a multi-layer structure that includes the above materials. For example, each of the first touch conductive layer 420 and the second touch conductive layer 440 has a triple-layered structure of titanium/aluminum/titanium.

The input sensing layer 400 includes a metal layer 470. The metal layer 470 is disposed in the first non-display area NDA1. In addition, the metal layer 470 is spaced apart from the inner surface of the opening 10H by a preset interval d. This, not only reduces the amount of heat transferred to the inside of the display panel 10 due to a laser beam used while the opening 10H is formed, but also reduces the amount of energy that is consumed.

The metal layer 470 is arranged around the opening 10H and surrounds the opening 10H. For example, the metal layer 470 has a doughnut shape or a ring shape in a plan view. In addition, the metal layer 470 may have a closed-loop shape or a shape in which a portion thereof is separated. The metal layer 470 includes a (3-1)st opening 470H. In a plan view, the (3-1)st opening 470H is wider than the first opening 100H. In addition, in a plan view, the (3-1)st opening 470H is wider than the third opening 400H.

A first surface 470-1 of the metal layer 470 is plasma-processed. For example, the first surface 470-1 is black. In addition, when the first surface 470-1 is plasma-processed, reflectivity increases as compared when the first surface 470-1 is not plasma-processed. As a result, when users view the metal layer 470 through the upper surface of the cover window 600, the first surface 470-1 appears black.

Similar to the second touch conductive layer 440, the metal layer 470 is disposed on the second touch insulating layer 430 and shielded by the third touch insulating layer 450. In addition, the metal layer 470 includes a material that is the same as or similar to a material of the second touch conductive layer 440. The metal layer 470 is simultaneously formed with the second touch conductive layer 440.

The first organic insulating layer 211 and the second organic insulating layer 213 each extends into the first non-display area NDA1. One edge of the first organic insulating layer 211 is located in the first non-display area NDA1. For example, FIG. 6 shows that a lateral surface that corresponds to one edge of the first organic insulating layer 211 is located in the first non-display area NDA1. One edge of the second organic insulating layer 213 is located in the first non-display area NDA1. For example, FIG. 6 shows that a lateral surface that corresponds to one edge of the second organic insulating layer 213 is located in the first non-display area NDA1. The second organic insulating layer 213 covers the lateral surface of the first organic insulating layer 211. One edge of the second organic insulating layer 213 is located closer to the transmissive area TA than one edge of the first organic insulating layer 211. One edge of each of the first organic insulating layer 211 and the second organic insulating layer 213 are spaced apart from the first partition wall PW1.

The detouring portions DL-C of the data lines DL are disposed on different layers with the first organic insulating layer 211 therebetween in the first non-display area NDA1. One of the detouring portions DL-C of adjacent data lines DL is disposed on the first organic insulating layer 211, and the other is disposed under the first organic insulating layer 211. The detouring portions DL-C of the data lines DL shown in FIG. 6 correspond to curved portions along the transmissive area TA in FIG. 5 located in the first non-display area NDA1.

At least one partition wall is disposed in the first non-display area NDA1. In an embodiment, although FIG. 6 shows three partition walls, embodiments are no necessarily limited thereto, and other embodiments include one, two, four or more partition walls.

The first partition wall PW1, the second partition wall PW2, and the third partition wall PW3 are arranged in the first non-display area NDA1, and spaced apart from each other in a direction that that extends from the display area DA to the transmissive area TA. The first partition wall PW1 is closest to the display area DA, the third partition wall PW3 is closest to the transmissive area TA, and the second partition wall PW2 is arranged between the first partition wall PW1 and the third partition wall PW3. The first partition wall PW1, the second partition wall PW2, and the third partition wall PW3 each has a closed-loop shape that surrounds the transmissive area TA and the opening 10H as shown in FIG. 5.

As shown in FIG. 6 and embodiments described below, because the first opening 100H is formed in the substrate 100 to correspond to the opening 10H of the display panel 10, the "transmissive area TA", the "opening 10H of the display panel 10", and the "first opening 100H of the substrate 100" may be used interchangeably in the present specification.

For example, "surround the opening 10H of the display panel 10" means "surround the first opening 100H of the substrate 100," and/or "surround the transmissive area TA."

The first partition wall PW1, the second partition wall PW2, and the third partition wall PW3 each includes an insulating material. For example, the first partition wall PW1, the second partition wall PW2, and the third partition wall PW3 each includes an organic insulating material, and is simultaneously formed during a process of forming a plurality of insulating material layers disposed in the display area DA.

The heights of the first partition wall PW1, the second partition wall PW2, and the third partition wall PW3 may be equal to or different from each other. FIG. 6 shows that the first partition wall PW1 and the second partition wall PW2 have the same height, and the third partition wall PW3 has a height lower than those of the first partition wall PW1, the second partition wall PW2, but embodiments are not necessarily limited thereto. In an embodiment, the first partition wall PW1, the second partition wall PW2, and the third partition wall PW3 each have different heights.

The at least one partition wall, such as the first partition wall PW1, the second partition wall PW2, and the third partition wall PW3, control a flow of a material that forms the organic encapsulation layer 320 during a process of forming the encapsulation layer 300. For example, the organic encapsulation layer 320 is formed by coating a monomer in the display area DA by using a process such as an inkjet process, etc., and then hardening the monomer. The partition wall controls the position of the organic encapsulation layer 320 by controlling the flow of the monomer. For example, FIG. 6 shows that an edge 320E of the organic encapsulation layer 320 is located on one side of the first partition wall PW1. In another embodiment, the edge 320E of the organic encapsulation layer 320 is located on a side surface of the first partition wall PW1, and a portion of the organic encapsulation layer 320 may overlap the upper surface of the first partition wall PW1.

Because the edge 320E of the organic encapsulation layer 320 is located on one side of one of the partition walls, such as the first partition wall PW1, the second inorganic encapsulation layer 330 directly contacts the first inorganic encapsulation layer 310 in the first non-display area NDA1. For example, the first and second inorganic encapsulation layers 310 and 330 directly contact each other in a region between the edge 320E of the organic encapsulation layer 320 and the opening 10H of the display panel 10. In an embodiment, FIG. 6 shows that the first and second inorganic encapsulation layers 310 and 330 directly contact each other in a region between the first partition wall PW1 and the opening 10H of the display panel 10.

The insulating layers of the input sensing layer 400, such as the first touch insulating layer 410, the second touch insulating layer 430, and the third touch insulating layer 450, extend into the first non-display area NDA1. The third touch insulating layer 450, which includes the organic insulating material, is disposed in the first non-display area NDA1, and covers the entire structure disposed under the third touch insulating layer 450. The third touch insulating layer 450 functions as a planarization layer, and thus, the upper surface of the input sensing layer 400 is substantially flat. For example, a vertical distance from the upper surface of the substrate 100 to the upper surface of the third touch insulating layer 450 in the display area DA is substantially the same as a vertical distance from the upper surface of the substrate 100 to the upper surface of the third touch insulating layer 450 in the first non-display area NDA1. Substantially the same means that the error is about 30% or less, or about 20% or less.

At least one organic material layer 222o included in the intermediate layer 222 covers the entire display area DA. The organic material layer 222o also extends into the first non-display area NDA1. The organic material layer 222o provides a path through which moisture is introduced. Because the organic material layer 222o includes a first opening 222oh located in the first non-display area NDA1, moisture that may be introduced through the opening 10H is prevented or reduced from permeating into the display area DA through the organic material layer 222o.

As shown in FIG. 6, a plurality of first openings 222oh of the organic material layer 222o are spaced apart from each other in the first non-display area NDA1. For example, FIG. 6 shows a first opening 222oh between the display area DA and the first partition wall PW1, a first opening 222oh between the first partition wall PW1 and the second partition wall PW2, a first opening 222oh between the second partition wall PW2 and the third partition wall PW3, and a first opening 222oh between the third partition wall PW3 and the opening 10H. When the organic material layer 222o includes the first functional layer 222a and the second functional layer 222c, the first opening 222oh includes an opening 222ah in the first functional layer 222a and an opening 222ch in the second functional layer 222c that overlap each other.

The organic material layer 222o includes separation portions 222op that are spaced apart from each other by the first opening 222oh in the first non-display area NDA1. When the organic material layer 222o includes the first functional layer 222a and the second functional layer 222c, the separation portions 222op include a separation portion 222ap in the first functional layer 222a, and a separation portion 222cp in the second functional layer 222c. According to an embodiment of FIG. 6, the separation portion 222op of the organic material layer 222o includes an overlapping structure of the separation portion 222ap of the first functional layer 222a and the separation portion 222cp of the second functional layer 222c.

Some of the first openings 222oh are respectively located between adjacent partition walls. For example, as shown in FIG. 6, some first openings 222oh are located between the first partition wall PW1 and the second partition wall PW2, and between the second partition wall PW2 and the third partition wall PW3.

The first opening 222oh that is closest to the display area DA is located to the left of the first partition wall PW1 in FIG. 6. A portion of the organic material layer 222o between the first electrode 221 and the second electrode 223 in the display area DA extends into the first non-display area NDA1 but does not cross the first partition wall PW1. The edge of a portion of the organic material layer 222o that extends from the display area DA into the first non-display area NDA1 is located on the left of the first partition wall PW1 in FIG. 6. For example, in the cross-sectional view of FIG. 6, a left portion of the first opening 222oh closest to the display area DA corresponds to the edge of a portion of the organic material layer 222o that extends from the display area DA into the first non-display area NDA1. A right portion of the first opening 222oh closest to the display area DA corresponds to the edge of the separation portion 222op closest to the display area DA.

Referring to FIG. 7, in an embodiment, each of the first openings 222oh extends along the edge of the opening 10H, and has a closed-loop shape that completely surrounds the opening 10H in a plan view. Accordingly, the separation portions 222op of the organic material layer 222o that are spaced apart from each other by the first opening 222oh also have a closed-loop shape that surrounds the entire transmissive area TA, as shown in FIG. 7. In a cross-section, the separation portions 222op of the organic material layer 222o each cover the first partition wall PW1, the second partition wall PW2, and the third partition wall PW3 as shown in FIG. 6. In addition, the metal layer 470 is disposed on the first partition wall PW1, the second partition wall PW2, and the third partition wall PW3.

Referring to FIG. 6 again, in an embodiment, the separation portion 222op of the organic material layer 222o disposed on the partition wall covers the upper surface and the lateral surfaces of the partition wall, and both edges directly contact the inorganic insulating layer under the partition wall. For example, the separation portion 222op of the organic material layer 222o disposed on the first partition wall PW1 directly contacts the upper surface and the lateral surface of the first partition wall PW1, and both edges directly contact the upper surface of the third interlayer insulating layer 210. Likewise, the separation portion 222op of the organic material layer 222o on the second partition wall PW2 or the third partition wall PW3 directly contact the upper surface and the lateral surfaces of the second partition wall PW2 or the third partition wall PW3, and both edges directly contact the upper surface of the third interlayer insulating layer 210.

A multi-insulating layer MIL includes a plurality of inorganic insulating layers, and the plurality of inorganic insulating layers denote two or more inorganic insulating layers. In an embodiment, the multi-insulating layer MIL includes the buffer layer 201, the first gate insulating layer 203, the first interlayer insulating layer 205, the second interlayer insulating layer 207, the second gate insulating layer 209, and the third interlayer insulating layer 210.

FIG. 6 shows that the second electrode 223 cover the entire display area DA and extends into the first non-display area NDA1, and an edge 223ep of the second electrode 223 is located between the display area DA and the first partition wall PW1.

In an embodiment, the edge 223ep of the second electrode 223 shown in FIG. 6 is a portion of the second electrode 223 closest to the opening 10H. There is no layer that corresponds to the second electrode 223 in a region between the edge 223ep of the second electrode 223 and the opening 10H. For example, there is no layer that has the same material and structure as the second electrode 223 being disposed between the edge 223ep of the second electrode 223 and the opening 10H.

The edge 223ep of the second electrode 223 is located between the display area DA and the first partition wall PW1. An edge 225ep of the capping layer 225 is located between the display area DA and the first partition wall PW1.

Like the second electrode 223, there is no layer that includes the same material and structure as the capping layer 225 being disposed between the edge 225ep of the capping layer 225 and the opening 10H.

The edge 223ep of the second electrode 223 and the edge 225ep of the capping layer 225 are covered by the first inorganic encapsulation layer 310, and overlap the organic encapsulation layer 320. The second electrode 223 is formed by forming a second electrode material layer that covers the entire display area DA and the first non-display area NDA1, and then removing a portion of the second electrode material layer from the first non-display area NDA1.

While the organic material layer 222*o* includes the plurality of first openings 222*oh*, the second electrode 223 and the capping layer 225 each respectively includes a single second opening 223*oh* and a single third opening 225*oh* as shown in FIG. 8. Referring to FIGS. 6, 7, and 8, in an embodiment, the second opening 223*oh* and third opening 225*oh* overlap the plurality of first openings 222*oh*. For example, the first opening 222*oh* and the separation portions 222*op* that are spaced apart from each other by the first opening 222*oh* are located inside the single second opening 223*oh* and/or the single third opening 225*oh*.

The first openings 222*oh* of the organic material layer 222*o*, the second opening 223*oh* of the second electrode 223, and the third opening 225*oh* of the capping layer 225 are formed by a laser lift-off process during a process of manufacturing the display panel 10. A laser beam in the laser lift-off process is refracted by the various layers of the partition wall formed on the substrate 100, such as the inorganic insulating layer and the organic insulating material, and moves toward the display area DA.

In an embodiment, the second interlayer insulating layer 207 and the third interlayer insulating layer 210 each include a plurality of layers that include different materials. For example, the second interlayer insulating layer 207 includes a first sub-layer that includes silicon nitride, and a second sub-layer that includes silicon oxide. The third interlayer insulating layer 210 includes a first sub-layer that includes silicon oxide, and a second sub-layer that includes silicon nitride. For example, the first sub-layers and the second sub-layers are each sequentially stacked. For example, the second sub-layer is disposed on the first sub-layer. In an embodiment, the buffer layer 201, the first gate insulating layer 203, and the second gate insulating layer 209 each includes the same material, such as silicon oxide, and the first interlayer insulating layer 205 includes silicon nitride.

Figure 9:
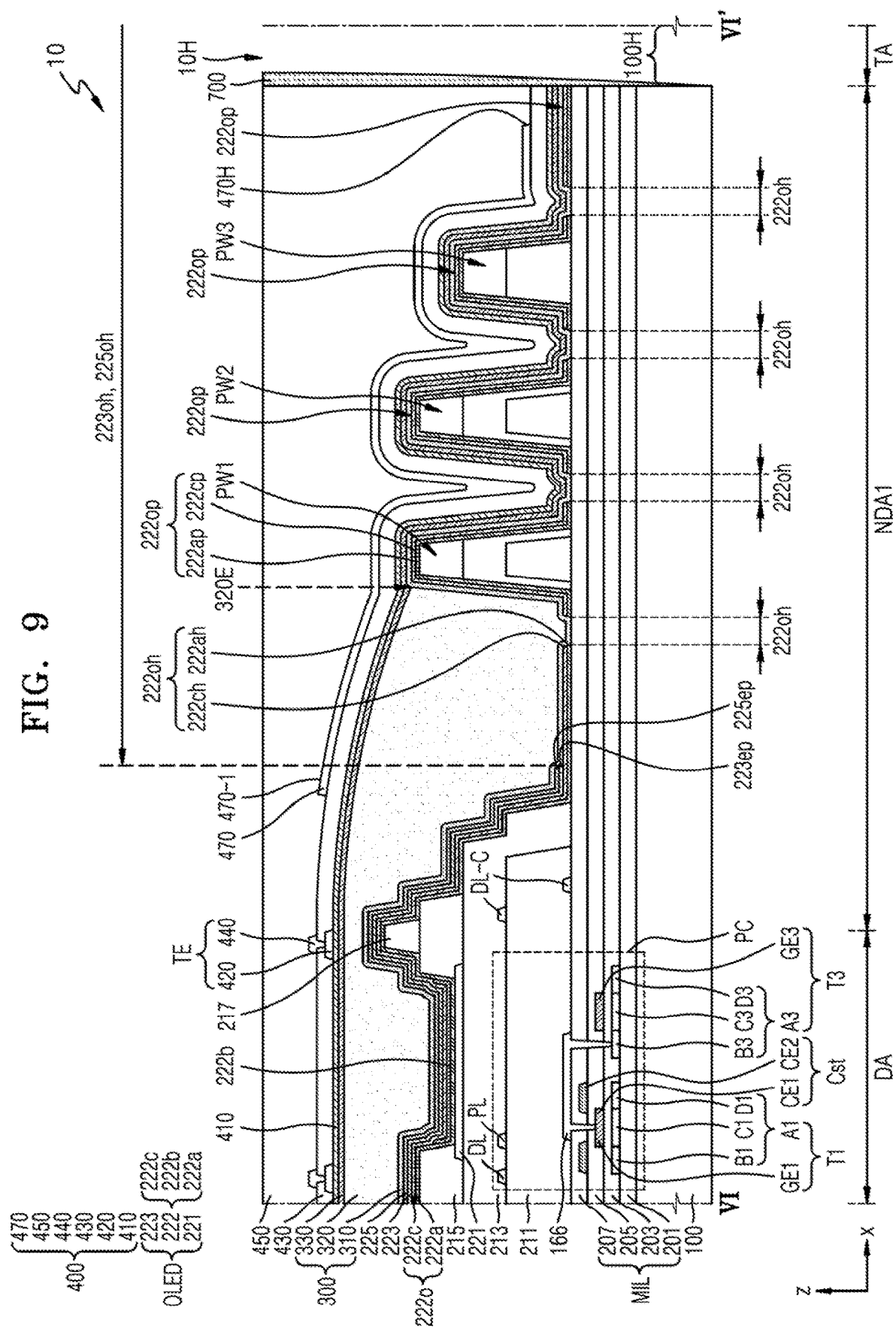
FIG. 9 is a cross-sectional view of a display panel according to an embodiment.
Figure 10:
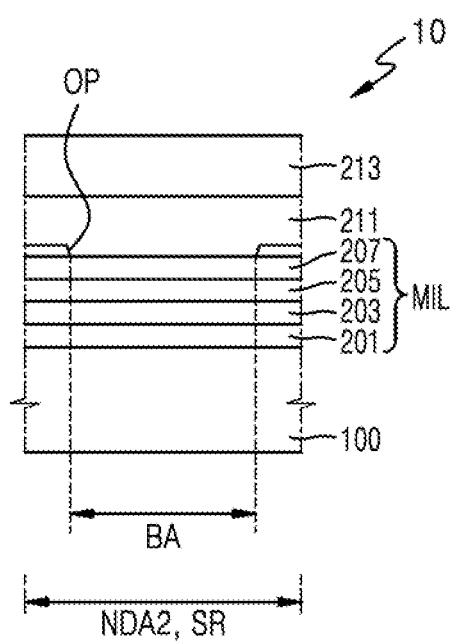
FIG. 10 illustrates a second non-display area of a display panel according to an embodiment.

FIG. 9 is a cross-sectional view of the display panel 10 according to an embodiment. FIG. 10 illustrates a second non-display area NDA2 of the display panel 10 according to an embodiment. The display panel 10 of FIG. 9 is a modification of the display panel 10 of FIG. 6 and differs in the third transistor T3 and the multi-insulating layer MIL. The display panel 10 of FIG. 9 is otherwise the same as the display panel 10 of FIG. 6. In FIG. 9, elements having the same reference numerals as those of FIG. 6 denote the same elements, and thus, differences are mainly described below.

Referring to the display area DA of the display panel 10 shown in FIG. 9, in an embodiment, the sub-pixel circuit PC and the organic light-emitting diode OLED are disposed on the substrate 100. As described above with reference to FIG. 4B, the sub-pixel circuit PC includes the plurality of transistors and the storage capacitor. For example, FIG. 9 shows the first transistor T1, the third transistor T3, and the storage capacitor Cst. The first semiconductor layer A1 of the first transistor T1 and the third semiconductor layer A3 of the third transistor T3 are disposed on the same layer, such as the buffer layer 201, and include the same material.

A plurality of insulating layers are formed between the substrate 100 and the first electrode 221 of the organic light-emitting diode OLED. For example, FIG. 9 shows the buffer layer 201, the first gate insulating layer 203, the first interlayer insulating layer 205, the second interlayer insulating layer 207, the first organic insulating layer 211, and the second organic insulating layer 213. Because the first semiconductor layer A1 and the third semiconductor layer A3 of the third transistor T3 are disposed on the same layer, such as the buffer layer 201, the second gate insulating layer 209 (see FIG. 6) and the third interlayer insulating layer 210 (see FIG. 6) described above with reference to FIG. 6 are omitted.

Referring to the first non-display area NDA1 of FIG. 9, the first to third partition walls PW1, PW2, and PW3 are spaced apart from each other. The organic material layer 222*o* includes the first openings 222*oh* and the separation portions 222*op* that are spaced apart from each other by the first openings 222*oh* in the first non-display area NDA1. The second electrode 223 and the capping layer 225 respectively include the second opening 223*oh* and the third opening 225*oh*.

The first openings 222*oh* and the separation portion 222*op* of the organic material layer 222*o*, the second opening 223*oh* and the edge 223*ep* of the second electrode 223, the third opening 225*oh* and the edge 225*ep* of the capping layer 225 are the same as those described above with reference to FIG. 6.

For example, the metal layer 470, which includes the first surface 470-1, is disposed in the first non-display area NDA1, and the light-blocking layer 700 is disposed in the opening 10H. Because the metal layer 470 and the light-blocking layer 700 are the same as or similar to those described with reference to FIG. 6, repeated descriptions thereof are omitted.

Referring to FIG. 10, in an embodiment, the multi-insulating layer MIL disposed on the substrate 100 is also provided in the second non-display area NDA2. As described above with reference to FIGS. 3A and 3B, the sub region SR the substrate 100, which is a portion of the second non-display area NDA2, includes a portion BA that is bent. For example, to facilitate bending, reduce the occurrence of cracks when the display panel 10 is bent, or prevent the cracks from propagating, the multi-insulating layer MIL includes the opening OP that corresponds to the bent portion of the sub-region SR.

The opening OP is formed by removing a portion of at least one of the sub-layers in the multi-insulating layer MIL. In an embodiment, FIG. 10 shows that the opening OP is formed by removing a portion of the second interlayer insulating layer 207 of the multi-insulating layer MIL.

Figure 11:
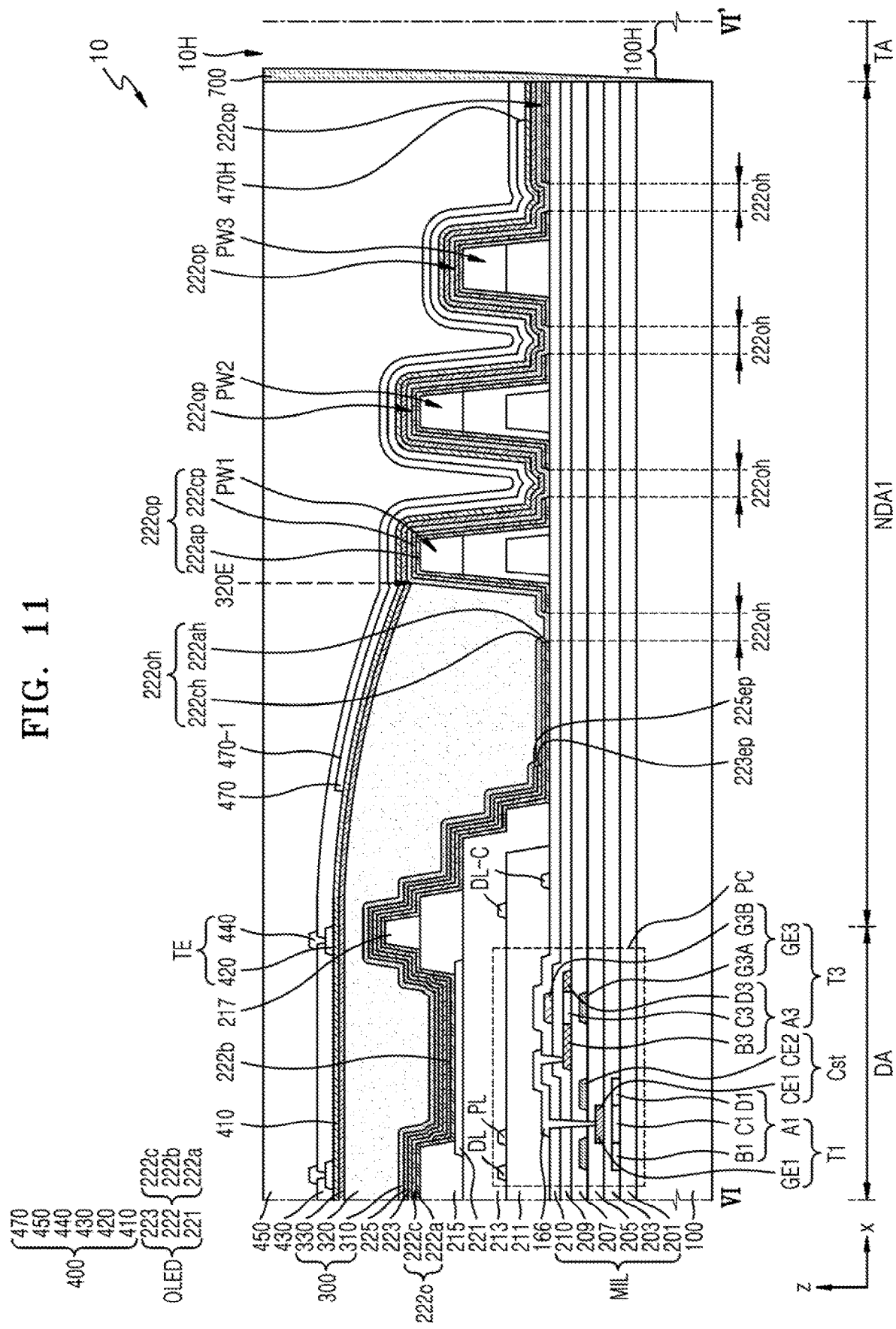
FIG. 11 is a cross-sectional view of a display panel according to an embodiment.

FIG. 11 is a cross-sectional view of the display panel 10 according to an embodiment. The display panel 10 of FIG. 11 is a modification of the display panel 10 of FIG. 6 and differs in the metal layer 470. The display panel 10 of FIG. 11 is otherwise the same as the display panel 10 of FIG. 6. In FIG. 11, elements having the same reference numerals as those of FIG. 6 denote the same elements, and thus, differences are mainly described below.

Referring to FIG. 11, in an embodiment, a plurality of insulating layers are formed between the substrate 100 and the first electrode 221 of the organic light-emitting diode OLED. For example, FIG. 11 shows the buffer layer 201, the first gate insulating layer 203, the first interlayer insulating layer 205, the second interlayer insulating layer 207, the second gate insulating layer 209, the third interlayer insulating layer 210, the first organic insulating layer 211, and the second organic insulating layer 213. The first semiconductor layer A1 and the third semiconductor layer A3 of the third transistor T3 are disposed on different layers. For example, the display panel 10 has a structure similar to that described with reference to FIG. 6.

Referring to the first non-display area NDA1 of FIG. 11, the first to third partition walls PW1, PW2, and PW3 are spaced apart from each other. The organic material layer 222*o* includes the first openings 222*oh* and the separation portions 222*op* that are spaced apart from each other by the first openings 222*oh* in the first non-display area NDA1. The second electrode 223 and the capping layer 225 respectively include the second opening (not shown) and the third opening (not shown).

The first openings 222*oh* and the separation portion 222*op* of the organic material layer 222*o*, the second opening and the edge 223*ep* of the second electrode 223, the third opening and the edge 225*ep* of the capping layer 225 are the same as those described above with reference to FIG. 6.

The metal layer 470 is disposed on the same layer, such as the first touch insulating layer 410, as the first touch conductive layer 420. For example, the metal layer 470 is disposed in the first non-display area NDA1 and includes the (3-1)st opening 470H. The end of the metal layer 470 is spaced apart from the opening 10H by a preset interval.

The metal layer 470 has a ring shape in a plan view. For example, the shape of the metal layer 470 corresponds to the shape of the opening 10H.

The light-blocking layer 700 is disposed inside the opening 10H. For example, the light-blocking layer 700 is the same as or similar to that described above.

Figure 12:
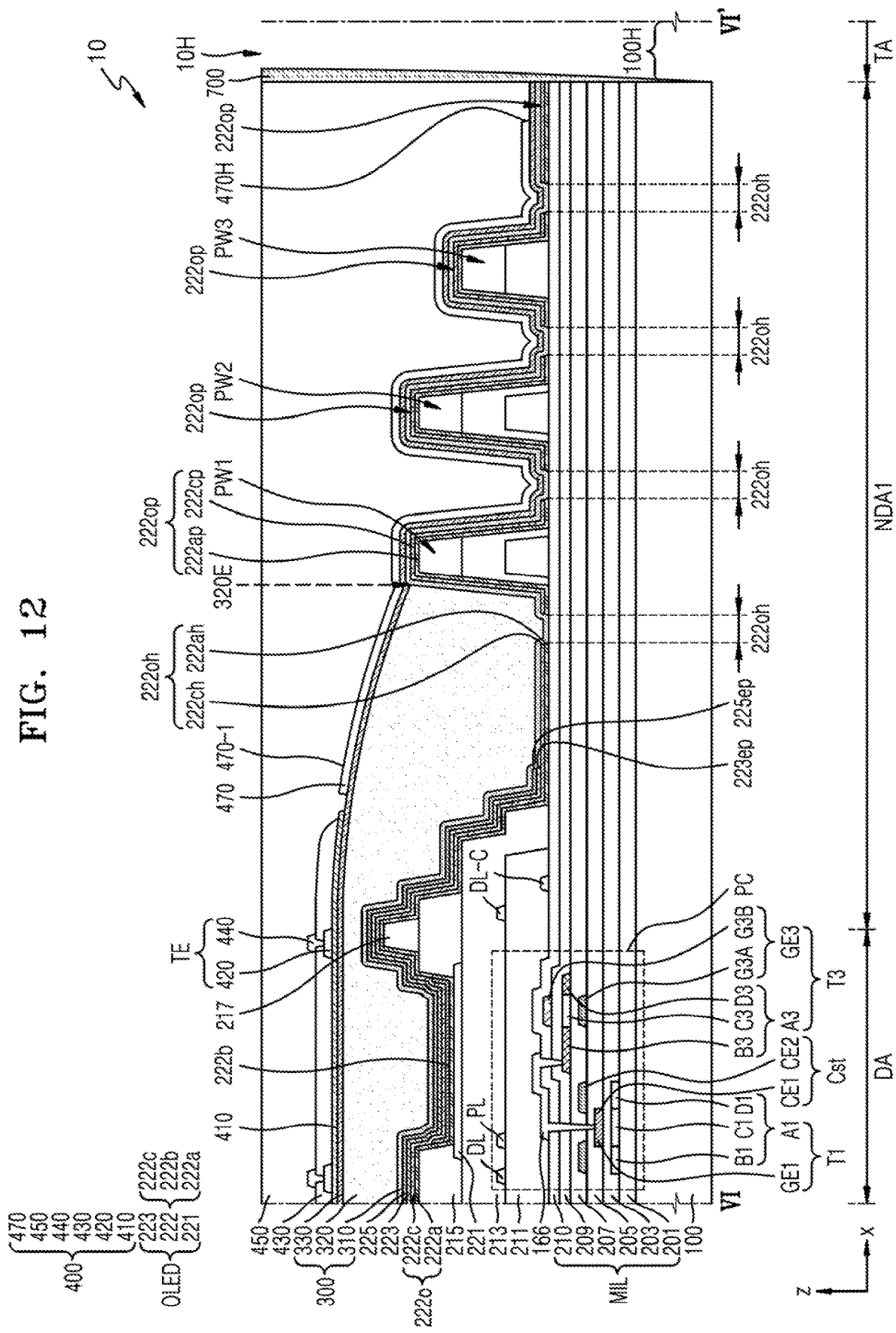
FIG. 12 is a cross-sectional view of a display panel according to an embodiment.

FIG. 12 is a cross-sectional view of the display panel 10 according to an embodiment. The display panel 10 of FIG. 12 is a modification of the display panel 10 of FIG. 6 and differs in the metal layer 470 and the first and second touch insulating layers 410 and 430. The display panel 10 of FIG. 12 is otherwise the same as the display panel 10 of FIG. 6. In FIG. 12, elements having the same reference numerals as those of FIG. 6 denote the same elements, and thus, differences are mainly described below.

Referring to FIG. 12, in an embodiment, a plurality of insulating layers are formed between the substrate 100 and the first electrode 221 of the organic light-emitting diode OLED. For example, FIG. 12 shows the buffer layer 201, the first gate insulating layer 203, the first interlayer insulating layer 205, the second interlayer insulating layer 207, the second gate insulating layer 209, the third interlayer insulating layer 210, the first organic insulating layer 211, and the second organic insulating layer 213. The first semiconductor layer A1 and the third semiconductor layer A3 of the third transistor T3 are disposed on different layers. For example, the display panel 10 has a structure similar to that described with reference to FIG. 6.

Referring to the first non-display area NDA1 of FIG. 12, the first to third partition walls PW1, PW2, and PW3 are spaced apart from each other. The organic material layer 222*o* includes the first openings 222*oh* and the separation portions 222*op* that are spaced apart from each other by the first openings 222*oh* in the first non-display area NDA1. The second electrode 223 and the capping layer 225 respectively include the second opening (not shown) and the third opening (not shown).

The first openings 222*oh* and the separation portion 222*op* of the organic material layer 222*o*, the second opening and the edge 223*ep* of the second electrode 223, the third opening and the edge 225*ep* of the capping layer 225 are the same as those described above with reference to FIG. 6.

The metal layer 470 is disposed on the encapsulation layer 300. For example, the edge of the first touch insulating layer 410 and the edge of the second touch insulating layer 430 are located in the first non-display area NDA1, and the metal layer 470 is starts at a point spaced apart from the edge of the first touch insulating layer 410 and the edge of the second touch insulating layer 430 toward the opening 10H. For example, the metal layer 470 directly contacts the second inorganic encapsulation layer 330 of the encapsulation layer 300. In addition, the third touch insulating layer 450 is disposed on the metal layer 470. The metal layer 470 is disposed in the first non-display area NDA1 and includes the (3-1)st opening 470H. For example, the end of the metal layer 470 is spaced apart from the opening 10H by a preset interval. For example, the metal layer 470 includes a material that is the same as or similar to a material of one of the first touch conductive layer 420 or the second touch conductive layer 440. In addition, the metal layer 470 is simultaneously formed with one of the first touch conductive layer 420 or the second touch conductive layer 440.

The position of the metal layer 470 is not limited to the above embodiments. In an embodiment, the metal layer 470 is disposed on the first touch insulating layer 410. In an embodiment, the first touch insulating layer 410 extends from the display area DA into the first non-display area NDA1. The metal layer 470 is disposed on the first touch insulating layer 410 in the first non-display area NDA1. For example, the second touch insulating layer 430 is not disposed on the first touch insulating layer 410 in the first non-display area NDA1.

The metal layer 470 has a ring shape in a plan view. For example, the shape of the metal layer 470 corresponds to the shape of the opening 10H.

The light-blocking layer 700 is disposed inside the opening 10H. The light-blocking layer 700 is the same as or similar to that described above.

Figure 13:
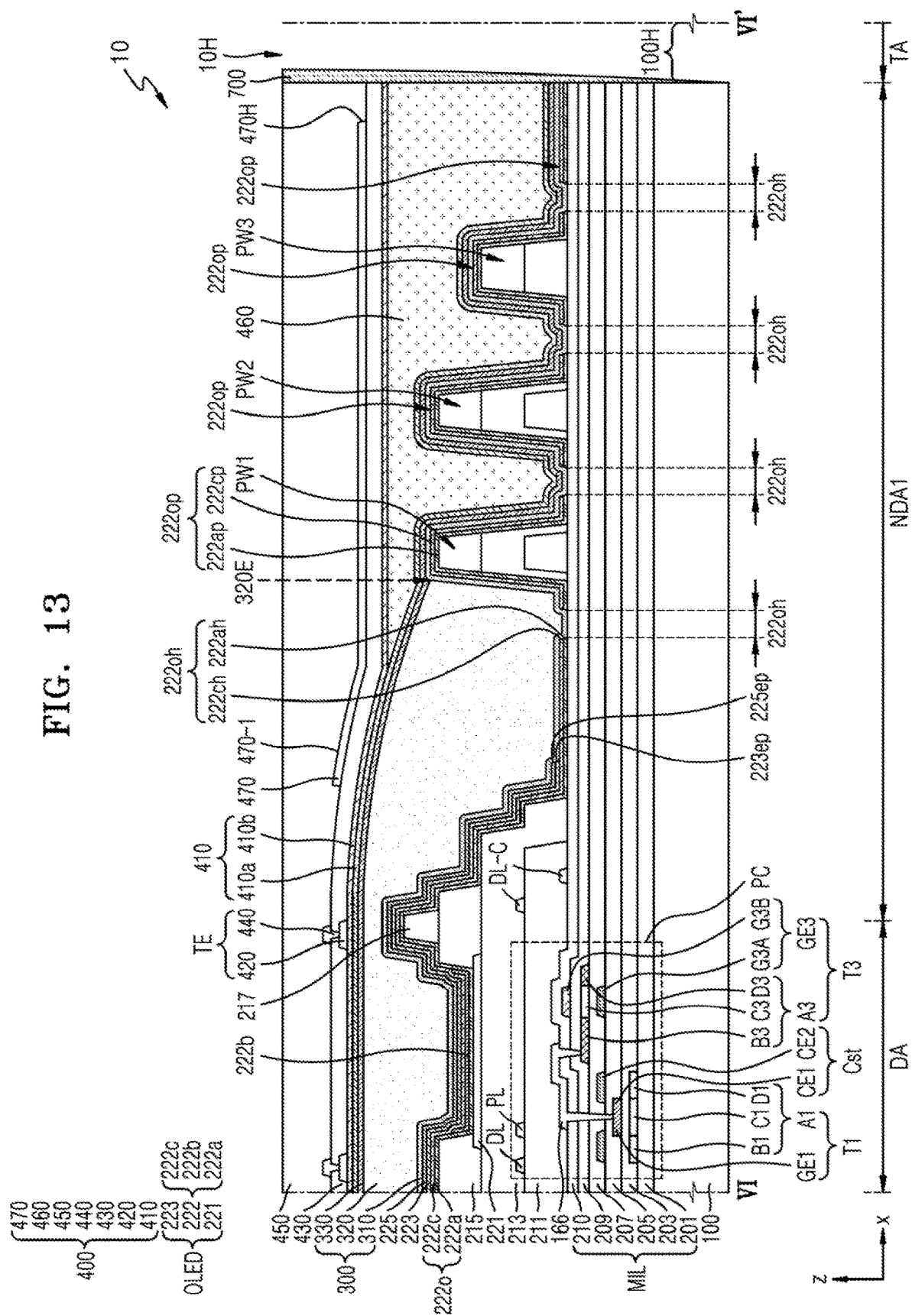
FIG. 13 is a cross-sectional view of a display panel according to an embodiment.

FIG. 13 is a cross-sectional view of the display panel 10 according to an embodiment. The display panel 10 of FIG. 13 is a modification of the display panel 10 of FIG. 6 and differs in the metal layer 470, the first touch insulating layer 410 and a fourth touch insulating layer 460. The display panel 10 of FIG. 13 is otherwise the same as the display panel 10 of FIG. 6. In FIG. 13, elements having the same reference numerals as those of FIG. 6 denote the same elements, and thus, differences are mainly described below.

Referring to FIG. 13, in an embodiment, a plurality of insulating layers are formed between the substrate 100 and the first electrode 221 of the organic light-emitting diode OLED. For example, FIG. 13 shows the buffer layer 201, the first gate insulating layer 203, the first interlayer insulating layer 205, the second interlayer insulating layer 207, the second gate insulating layer 209, the third interlayer insulating layer 210, the first organic insulating layer 211, and the second organic insulating layer 213. The first semiconductor layer A1 and the third semiconductor layer A3 of the third transistor T3 are disposed on different layers. For example, the display panel 10 has a structure similar to that described with reference to FIG. 6.

Referring to the first non-display area NDA1 of FIG. 13, the first to third partition walls PW1, PW2, and PW3 are spaced apart from each other. The organic material layer 222*o* includes the first openings 222*oh* and the separation portions 222*op* that are spaced apart from each other by the first openings 222*oh* in the first non-display area NDA1. The second electrode 223 and the capping layer 225 respectively include the second opening (not shown) and the third opening (not shown).

The input sensing layer 400 is disposed on the encapsulation layer 300. For example, the input sensing layer 400 includes the first touch insulating layer 410, the second touch insulating layer 430, the first touch conductive layer 420, the second touch conductive layer 440, the third touch insulating layer 450, the metal layer 470, and the fourth touch insulating layer 460. Because the second touch insulating layer 430, the first touch conductive layer 420, the second touch conductive layer 440, the third touch insulating layer 450 are the same as or similar to those described with reference to FIG. 6, repeated descriptions thereof are omitted.

The first touch insulating layer 410 is disposed on the encapsulation layer 300. For example, the first touch insulating layer 410 includes a (1-1)st touch insulating layer 410a and a (1-2)nd touch insulating layer 410b. For example, the (1-1)st touch insulating layer 410a and the (1-2)nd touch insulating layer 410b may include a material that is the same as or similar to a material of the first touch insulating layer 410 described with reference to FIG. 6.

The (1-1)st touch insulating layer 410a and the (1-2)nd touch insulating layer 410b are stacked and in contact each other in the display area DA, but the (1-1)st touch insulating layer 410a and the (1-2)nd touch insulating layer 410b are separated from each other in the first non-display area NDA1. For example, the fourth touch insulating layer 460 is disposed between the (1-1)st touch insulating layer 410a and the (1-2)nd touch insulating layer 410b in the first non-display area NDA1. The fourth touch insulating layer 460 is an organic insulating layer. For example, the fourth touch insulating layer 460 includes a polymer-based material. For example, the fourth touch insulating layer 460 includes at least one of a silicon-based resin, an acryl-based resin, an epoxy-based resin, polyimide, or a polyethylene. The polymer-based material is transparent. The fourth touch insulating layer 460 has a ring shape that surrounds the opening 10H in a plan view.

The metal layer 470 is disposed on the second touch insulating layer 430. The metal layer 470 has a shape that is the same as or similar to that described with reference to FIG. 6.

In addition, the metal layer 470 can be arranged at various positions. For example, in an embodiment, when the metal layer 470 is disposed directly on and in contact with the second inorganic encapsulation layer 330 in the first non-display area NDA1, at least one of the (1-1)st touch insulating layer 410a, the fourth touch insulating layer 460, the (1-2)nd touch insulating layer 410b, the second touch insulating layer 430, or the third touch insulating layer 450 is disposed on the metal layer 470. In an embodiment, when the metal layer 470 is disposed directly on and in contact with the (1-1)st touch insulating layer 410a in the first non-display area NDA1, at least one of the fourth touch insulating layer 460, the (1-2)nd touch insulating layer 410b, the second touch insulating layer 430, or the third touch insulating layer 450 is disposed on the metal layer 470. In an embodiment, when the metal layer 470 is disposed directly on and in contact with the fourth touch insulating layer 460 in the first non-display area NDA1, at least one of the (1-2)nd touch insulating layer 410b, the second touch insulating layer 430, or the third touch insulating layer 450 is disposed on the metal layer 470. For example, the (1-1)st touch insulating layer 410a may or may not be disposed under the fourth touch insulating layer 460 in the first non-display area NDA1. In an embodiment, when the metal layer 470 is disposed directly on and in contact with the (1-2)nd touch insulating layer 410b in the first non-display area NDA1, at least one of the second touch insulating layer 430 or the third touch insulating layer 450 is disposed on the metal layer 470. For example, at least one of the (1-1)st touch insulating layer 410a or the fourth touch insulating layer 460 may or may not be disposed under the (1-2)nd touch insulating layer 410b in the first non-display area NDA1. In an embodiment, when the metal layer 470 is disposed on and in contact with the second touch insulating layer 430 in the first non-display area NDA1, the third touch insulating layer 450 is disposed on the metal layer 470. For example, at least one of the (1-1)st touch insulating layer 410a, the (1-2)nd touch insulating layer 410b, or the fourth touch insulating layer 460 may or may not be disposed under the second touch insulating layer 430 in the first non-display area NDA1.

The metal layer 470 has a ring shape in a plan view. For example, the shape of the metal layer 470 corresponds to the shape of the opening 10H.

The light-blocking layer 700 is disposed inside the opening 10H. The light-blocking layer 700 is the same as or similar to that described above.

Figure 14:
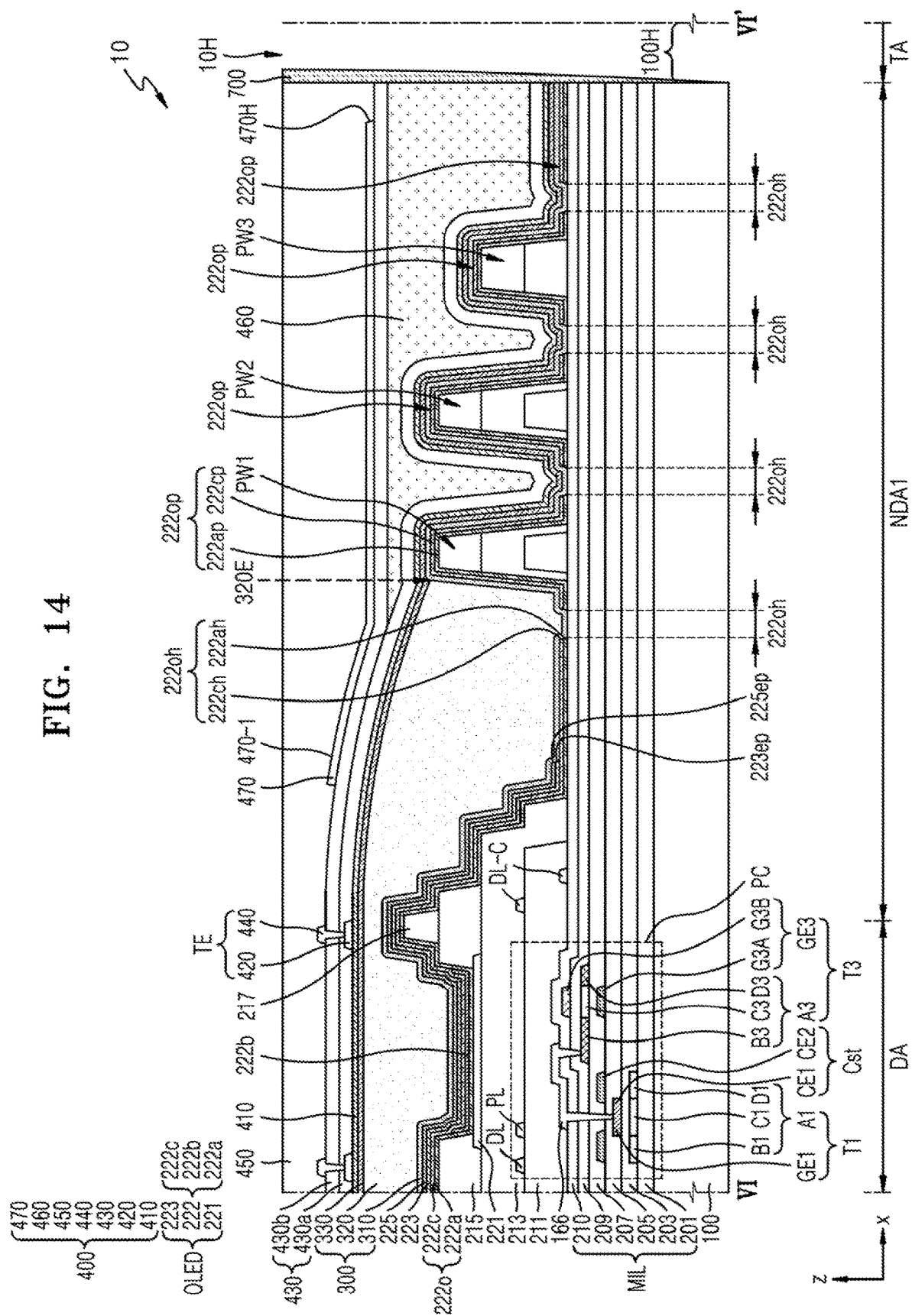
FIG. 14 is a cross-sectional view of a display panel according to an embodiment.

FIG. 14 is a cross-sectional view of the display panel 10 according to an embodiment. The display panel 10 of FIG. 14 is a modification of the display panel 10 of FIG. 13 and differs in the second touch insulating layer 430. The display panel 10 of FIG. 14 is otherwise the same as the display panel 10 of FIG. 13. In FIG. 14, elements having the same reference numerals as those of FIG. 13 denote the same elements, and thus, differences are mainly described below.

Referring to FIG. 14, in an embodiment, a plurality of insulating layers are formed between the substrate 100 and the first electrode 221 of the organic light-emitting diode OLED. For example, FIG. 14 shows the buffer layer 201, the first gate insulating layer 203, the first interlayer insulating layer 205, the second interlayer insulating layer 207, the second gate insulating layer 209, the third interlayer insulating layer 210, the first organic insulating layer 211, and the second organic insulating layer 213. The first semiconductor layer A1 and the third semiconductor layer A3 of the third transistor T3 are disposed on different layers. For example, the display panel 10 has a structure similar to that described with reference to FIG. 13.

Referring to the first non-display area NDA1 of FIG. 14, the first to third partition walls PW1, PW2, and PW3 are spaced apart from each other. The organic material layer 222o includes the first openings 222oh and the separation portions 222op that are spaced apart from each other by the first openings 222oh in the first non-display area NDA1. The second electrode 223 and the capping layer 225 respectively include the second opening (not shown) and the third opening (not shown).

The input sensing layer 400 is disposed on the encapsulation layer 300. For example, the input sensing layer 400 includes the first touch insulating layer 410, the second touch insulating layer 430, the first touch conductive layer 420, the second touch conductive layer 440, the third touch insulating layer 450, the metal layer 470, and a fourth touch insulating layer 460. Because the first touch insulating layer 410, the first touch conductive layer 420, the second touch conductive layer 440, the third touch insulating layer 450, and the fourth touch insulating layer 460 are the same as or similar to those described with reference to FIG. 13, detailed descriptions thereof are omitted.

The second touch insulating layer 430 includes a (2-1)st touch insulating layer 430a and a (2-2)nd touch insulating layer 430b stacked in the display area DA and separated from each other in the first non-display area NDA1. Because the (2-1)st touch insulating layer 430a and the (2-2)nd touch insulating layer 430b are the same as or similar to the second touch insulating layer 430 described with reference to FIG. 6, a repeated description thereof is omitted.

The fourth touch insulating layer 460 is disposed between the (2-1)st touch insulating layer 430a and the (2-2)nd touch insulating layer 430b in the first non-display area NDA1. For example, the fourth touch insulating layer 460 serves as a planarization layer.

The metal layer 470 may be disposed at various positions. In an embodiment, the metal layer 470 in the first non-display area NDA1 is disposed directly on and in contact with the second inorganic encapsulation layer 330. For example, at least one of the first touch insulating layer 410, the (2-1)st touch insulating layer 430a, the fourth touch insulating layer 460, the (2-2)nd touch insulating layer 430b, or the third touch insulating layer 450 is disposed on the metal layer 470 in the first non-display area NDA1. In an embodiment, the metal layer 470 in the first non-display area NDA1 is disposed directly on and in contact with the first touch insulating layer 410. For example, at least one of the (2-1)st touch insulating layer 430a, the fourth touch insulating layer 460, the (2-2)nd touch insulating layer 430b, or the third touch insulating layer 450 is disposed on the metal layer 470 in the first non-display area NDA1. In an embodiment, the metal layer 470 in the first non-display area NDA1 is disposed directly on and in contact with the (2-1)st touch insulating layer 430a. For example, at least one of the fourth touch insulating layer 460, the (2-2)nd touch insulating layer 430b, or the third touch insulating layer 450 is disposed on the metal layer 470 in the first non-display area NDA1. In addition, the first touch insulating layer 410 may or may not be disposed under the (2-1)st touch insulating layer 430a in the first non-display area NDA1. In an embodiment, the metal layer 470 in the first non-display area NDA1 is disposed directly on and in contact with the fourth touch insulating layer 460. For example, at least one of the (2-2)nd touch insulating layer 430b or the third touch insulating layer 450 is disposed on the metal layer 470 in the first non-display area NDA1. In addition, at least one of the first touch insulating layer 410 or the (2-1)st touch insulating layer 430a may or may not be disposed under the fourth touch insulating layer 460 in the first non-display area NDA1. In an embodiment, the metal layer 470 in the first non-display area NDA1 is disposed directly on and in contact with the (2-2)nd touch insulating layer 430b as shown in FIG. 14. For example, the third touch insulating layer 450 is disposed on the metal layer 470, and at least one of the first touch insulating layer 410, the (2-1)st touch insulating layer 430a, or the fourth touch insulating layer 460 may or may not be disposed under the (2-2)nd touch insulating layer 430b.

The metal layer 470 has a ring shape in a plan view. For example, the shape of the metal layer 470 corresponds to the shape of the opening 10H.

The light-blocking layer 700 is disposed inside the opening 10H. The light-blocking layer 700 is the same as or similar to that described above.

In addition, in an embodiment, the first touch insulating layer 410 may include a (1-1)st touch insulating layer and a (1-2)nd touch insulating layer as shown in FIG. 13.

According to embodiments, visibility of wavy patterns in the opening portion is reduced, and the periphery of the opening appears black.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel, comprising:
   a substrate that includes a display area and a first opening;
   a light-emitting element disposed in the display area;
   an encapsulation layer disposed on the light-emitting element, wherein the encapsulation layer includes at least one inorganic encapsulation layer, an organic encapsulation layer, and a second opening that corresponds to the first opening; and
   an input sensing layer disposed on the encapsulation layer and that includes a third opening that corresponds to the second opening,
   wherein the input sensing layer includes a metal layer that surrounds the third opening.

2. The display panel of claim 1, wherein the metal layer includes a first sub-opening that corresponds to the third opening.

3. The display panel of claim 2, wherein the first sub-opening is wider than the third opening in a plan view.

4. The display panel of claim 1, wherein the input sensing layer further includes:
   a first touch insulating layer disposed on the encapsulation layer;
   a first touch conductive layer disposed on the first touch insulating layer;
   a second touch insulating layer disposed on the first touch conductive layer; and
   a second touch conductive layer disposed on the second touch insulating layer.

5. The display panel of claim 4, wherein the metal layer includes a same material as one of the first touch conductive layer or the second touch conductive layer.

6. The display panel of claim 4, wherein the metal layer is disposed on one of the first touch insulating layer or the second touch insulating layer.

7. The display panel of claim 1, wherein the metal layer directly contacts the encapsulation layer.

8. The display panel of claim 1, wherein an upper surface of the metal layer is plasma-processed.

9. The display panel of claim 1, further comprising a first light-blocking layer disposed on at least one of an inner surface of the first opening, an inner surface of the second opening, or an inner surface of the third opening.

10. The display panel of claim 9, wherein a width of a cross-section of the first light-blocking layer increases from the first opening toward the third opening.

11. The display panel of claim 9, wherein the first light-blocking layer includes black ink.

12. The display panel of claim 1, further comprising a cover window disposed on the input sensing layer.

13. The display panel of claim 12, further comprising a second light-blocking layer that includes a fifth opening and is disposed on a lower surface of the cover window, wherein the fifth opening corresponds to the first opening.

14. The display panel of claim 13, wherein the third opening is wider than the fifth opening in a plan view.

15. The display panel of claim 12, further comprising an adhesive layer disposed between the cover window and the input sensing layer.

16. The display panel of claim 15, wherein the adhesive layer includes a sixth opening that corresponds to the first opening, and
   the sixth opening is wider than the first opening in a plan view.

17. An electronic apparatus, comprising:
a display panel that includes a transmissive area, a display area, and a first non-display area disposed between the transmissive area and the display area; and
a component disposed below the display panel and that corresponds to the transmissive area,
wherein the display panel includes:
a substrate that includes a first opening;
a light-emitting element disposed in the display area;
an encapsulation layer disposed on the light-emitting element, wherein the encapsulation layer includes at least one inorganic encapsulation layer, an organic encapsulation layer, and a second opening that corresponds to the first opening; and
an input sensing layer disposed on the encapsulation layer and that includes a third opening that corresponds to the second opening,
wherein the input sensing layer includes a metal layer that surrounds the third opening.

18. The electronic apparatus of claim 17, wherein the metal layer includes a first sub-opening that corresponds to the third opening, and
the first sub-opening is wider than the third opening in a plan view.

19. The electronic apparatus of claim 17, wherein the input sensing layer further includes:
a first touch insulating layer disposed on the encapsulation layer;
a first touch conductive layer disposed on the first touch insulating layer;
a second touch insulating layer disposed on the first touch conductive layer; and
a second touch conductive layer disposed on the second touch insulating layer, and
the metal layer includes a same material as one of the first touch conductive layer or the second touch conductive layer.

20. The electronic apparatus of claim 19, wherein the metal layer is disposed on one of the first touch insulating layer or the second touch insulating layer.

21. The electronic apparatus of claim 17, wherein the metal layer directly contacts the encapsulation layer.

22. The electronic apparatus of claim 17, wherein an upper surface of the metal layer is plasma-processed.

23. The electronic apparatus of claim 17, further comprising a first light-blocking layer disposed on at least one of an inner surface of the first opening, an inner surface of the second opening, or an inner surface of the third opening.

24. The electronic apparatus of claim 23, wherein a width of a cross-section of the first light-blocking layer increases from the first opening toward the third opening.

25. The electronic apparatus of claim 17, wherein the display panel further includes:
a cover window disposed on the input sensing layer; and
an adhesive layer disposed between the input sensing layer and the cover window.

26. The electronic apparatus of claim 25, wherein the display panel further includes a second light-blocking layer that includes a fifth opening and is disposed on a lower surface of the cover window, wherein the fifth opening corresponds to the first opening.

27. The electronic apparatus of claim 26, wherein the third opening is wider than the fifth opening in a plan view.

28. The electronic apparatus of claim 25, wherein the adhesive layer includes a sixth opening that corresponds to the first opening, and
the sixth opening is wider than the first opening in a plan view.

* * * * *